United States Patent
Amano et al.

(10) Patent No.: US 7,191,421 B2
(45) Date of Patent: Mar. 13, 2007

(54) INTEGRATED CIRCUIT DESIGN APPARATUS, METHOD AND PROGRAM EVALUATING CONDITION OF FUNCTIONAL BLOCKS, ASSIGNED TO VIRTUAL PLACEMENT REGIONS IN EACH OF LOWER-AND HIGHER-RANK MOUNTING BLOCKS

(75) Inventors: Yasuo Amano, Kawasaki (JP); Hiroshi Seki, Kawasaki (JP); Yukio Makino, Kawasaki (JP); Yumiko Yamanishi, Kawasaki (JP); Yoshiko Nakanishi, Kawasaki (JP); Yoichiro Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/103,895

(22) Filed: Mar. 25, 2002

(65) Prior Publication Data
US 2003/0046646 A1 Mar. 6, 2003

(30) Foreign Application Priority Data
Sep. 3, 2001 (JP) .............................. 2001-266401

(51) Int. Cl.
G06F 9/45 (2006.01)
G06F 17/50 (2006.01)
(52) U.S. Cl. .................... 716/10; 716/1; 716/6; 716/8; 716/9; 716/11; 703/14
(58) Field of Classification Search ................ 716/1, 716/6, 8, 9, 10, 12, 13, 18; 711/114; 706/50; 703/14; 365/189.01; 257/300
See application file for complete search history.

(56) References Cited

U.S. PATENT DOCUMENTS

| | | | | |
|---|---|---|---|---|
| 5,218,551 A | * | 6/1993 | Agrawal et al. | ............... 716/10 |
| 5,333,032 A | * | 7/1994 | Matsumoto et al. | ........... 716/6 |
| 5,475,608 A | * | 12/1995 | Masuoka | ....................... 716/8 |
| 5,663,889 A | * | 9/1997 | Wakita | ........................... 716/6 |
| 5,787,268 A | * | 7/1998 | Sugiyama et al. | ............. 716/11 |
| 5,815,655 A | * | 9/1998 | Koshiyama | ................... 714/45 |

(Continued)

OTHER PUBLICATIONS

Schulz et al., "Hierarchical physical design system", ompEuro '89., 'VLSI and Computer Peripherals. VLSI and Microelectronic Applications in Intelligent Peripherals and their Interconnection Networks', Proceedings. , 8-12, May 1989, pp. 5/20-5/24.*

(Continued)

*Primary Examiner*—Jack Chiang
*Assistant Examiner*—Helen Rossoshek
(74) *Attorney, Agent, or Firm*—Staas & Halsey LLP

(57) ABSTRACT

An integrated circuit design apparatus includes a block placement processing unit which performs processing of creation of a lower-rank mounting block in a higher-rank mounting block, and performs processing of creation of virtual placement regions in each of the lower-rank mounting block and the higher-rank mounting block. A functional block assignment processing unit performs processing of assignment of functional blocks to each of the virtual placement regions provided by the block placement processing unit. An evaluation processing unit provides a display of a condition of the functional blocks assigned to each of the virtual placement regions of both the lower-rank mounting block and the higher-rank mounting block, in order to evaluate the condition of the assigned functional blocks.

27 Claims, 24 Drawing Sheets

U.S. PATENT DOCUMENTS

| | | | |
|---|---|---|---|
| 6,086,625 | A * | 7/2000 | Shouen .......................... 716/1 |
| 6,117,183 | A * | 9/2000 | Teranishi et al. ............. 716/11 |
| 6,167,561 | A * | 12/2000 | Chen et al. ................... 716/18 |
| 6,169,968 | B1 * | 1/2001 | Kabuo .......................... 703/14 |
| 6,240,541 | B1 * | 5/2001 | Yasuda et al. ................. 716/6 |
| 6,249,902 | B1 * | 6/2001 | Igusa et al. ................... 716/10 |
| 6,308,305 | B1 * | 10/2001 | Sugiyama et al. ............. 716/6 |
| 6,567,965 | B2 * | 5/2003 | Sakagami et al. ............ 716/10 |
| 6,665,852 | B2 * | 12/2003 | Xing et al. ................... 716/12 |
| 6,748,574 | B2 * | 6/2004 | Sasagawa et al. ............. 716/9 |

OTHER PUBLICATIONS

Kim et al., "An improved hierarchical placement technique using clustering and region refinement", Circuits and Systems, 1996., IEEE Asia Pacific Conference on, Nov. 18-21, 1996, pp. 393-396.*

\* cited by examiner

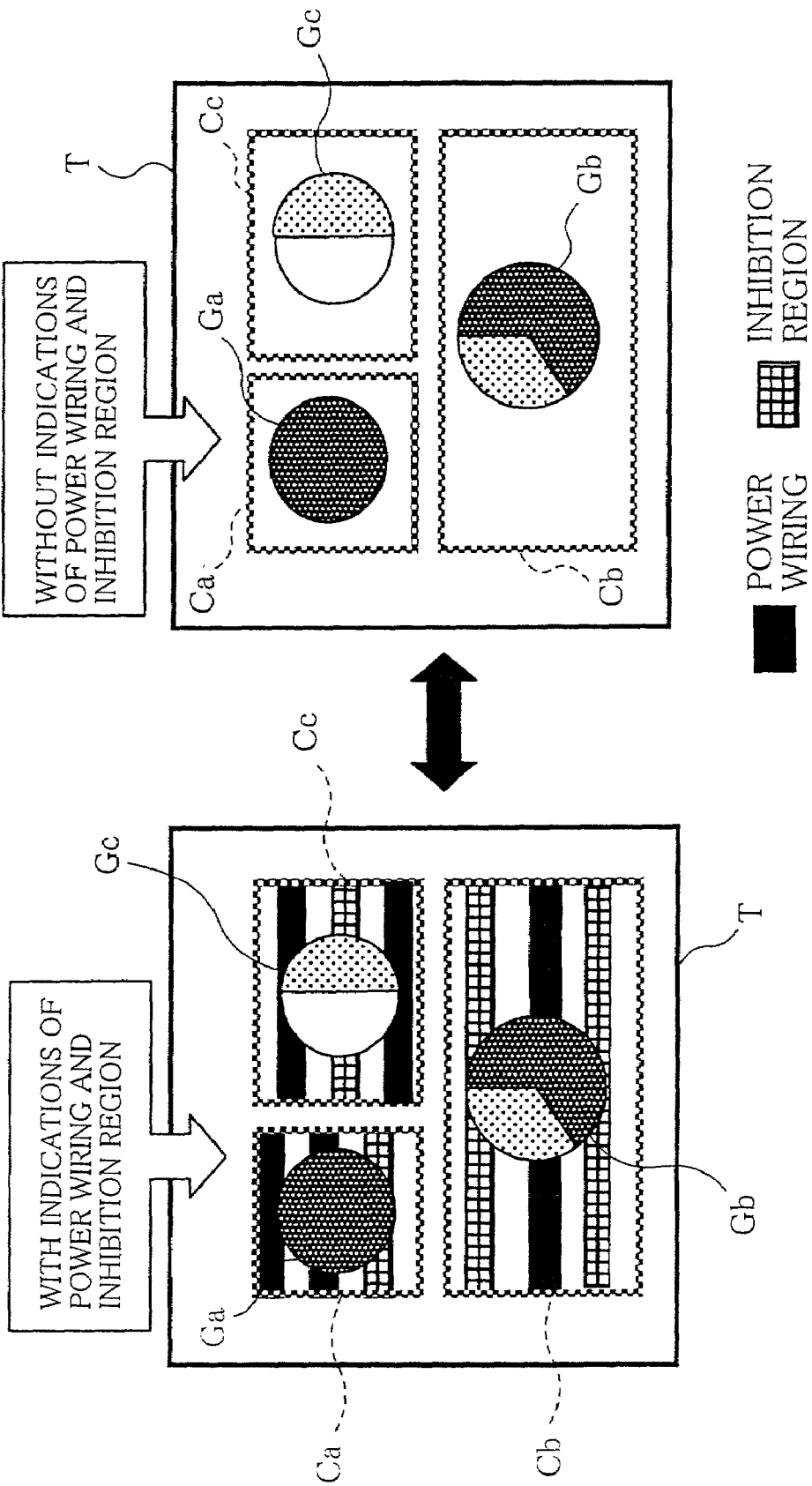

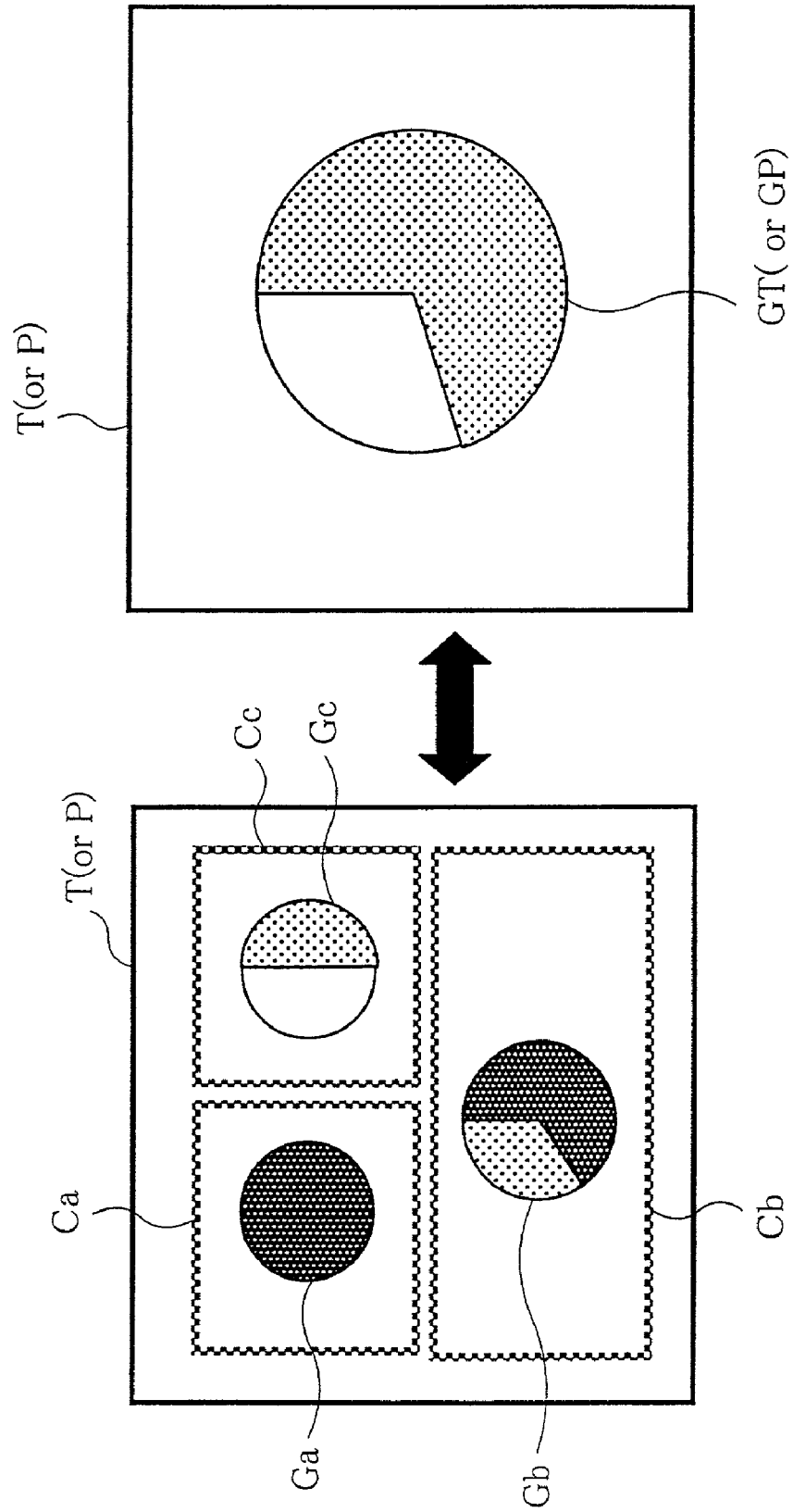

COURT
COURT BEING GROUPED AS MOUNTING BLOCK
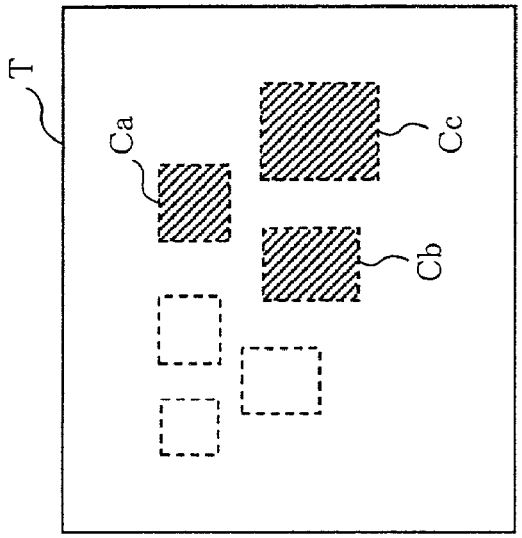
FIG.9A
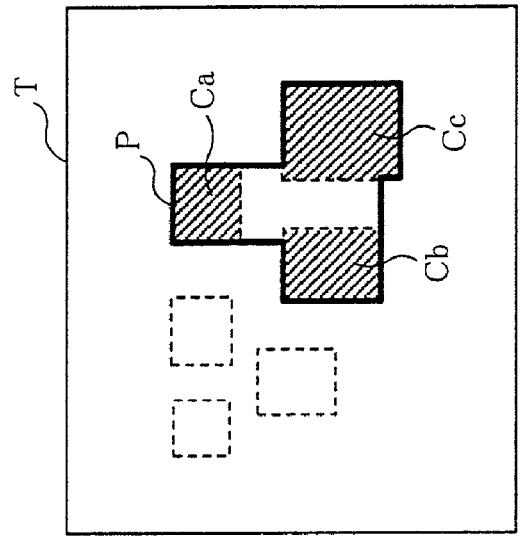
FIG.9B

MOUNTING BLOCK P

COURT Ca  COURT Cb  COURT Cc

High_BLOCK ← HIGHER-RANK MOUNTING BLOCK NAMA D1
0.0001mm² ← COURT AREA DATA D2
76% ← CELL RATIO DATA D3
BLKA
BLKB      } NAMES D4 OF FUNCTIONAL BLOCKS OR CELLS ASSIGNED TO COURT OF CONCERN
CELL1
CELL2

High_BLOCK
0.0001mm²
76%
BLKA
BLKB
CELL1
CELL2    LOCK — DSP1

FIG.11A
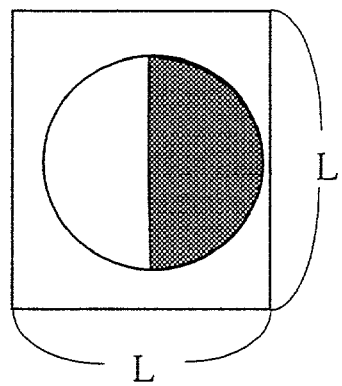
FIG.11B
| CELL RATIO | 40 | % | ASPECT RATIO | 1:1 |
| MARGIN | 1 | | | |
FIG.11C
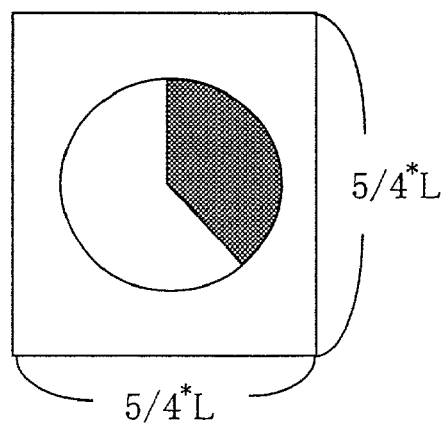

MOUNTING BLOCK P

COURT Ca    COURT Cb

MOUNTING BLOCK P

COURT Ca    COURT Ca

} FUNCTIONAL BLOCKS OR CELLS BEING MOVED

MOUNTING BLOCK P

COURT Ca    COURT Cb

FIG.15B    IMAGES OF COURTS AFTER 3 x 3 DIVISION

|  | Tline | Tcell | Total |
|---|---|---|---|
| Ba->Bb | 200ps | 10ps |  |
| Bb->Bc | 100ps | 20ps | 330ps |
| Bc->Bd | 150ps | 50ps | 530ps |
| Bd->Be | 250ps | 30ps | 810ps |

INTEGRATED CIRCUIT DESIGN APPARATUS, METHOD AND PROGRAM EVALUATING CONDITION OF FUNCTIONAL BLOCKS, ASSIGNED TO VIRTUAL PLACEMENT REGIONS IN EACH OF LOWER-AND HIGHER-RANK MOUNTING BLOCKS

BACKGROUND OF THE INVENTION

1. Field of the Invention

The present invention relates to an integrated circuit design apparatus, an integrated circuit design method and an integrated circuit design program for designing an integrated circuit.

2. Description of the Related Art

In recent years, the shortening of design time for integrated circuits is demanded with diversification of products. To shorten the design time of an integrated circuit, it is necessary to reduce the number of man-hours or the number of steps needed to carry out the integrated circuit design process.

A conventional integrated circuit design device performs the design of an integrated circuit by using a floor plan display function and a timing analysis function. The floor plan display function is a function to display mounting blocks as the processing units and the display units. The timing analysis function is a function to calculate a simplified path delay based on the distance between the mounting blocks.

The conventional integrated circuit design device performs the design on a mounting-block basis by using the floor plan display function, and calculates and analyzes the delay between the arranged mounting blocks by using the timing analysis function. And such procedures are repeated such that the calculated delay approaches the desired delay.

Moreover, in the design using the hardware description language, the delay information that is used at the time of circuit composition, such as the number of cells and the gate delay, is utilized for the timing analysis in the floor plan.

However, the processing unit with which the conventional integrated circuit design device performs is the mounting block. The scale of the logic circuits in the mounting block amounts to hundreds of thousands gates. When the integrated circuit design process is performed on a mounting-block basis, the processing time needed is considerably large, and the accuracy of the analysis result by the timing analysis function deteriorates, which causes the error between the timing analysis result and the actual design to become large. For this reason, the re-design or design change work must be frequently performed in order to make the calculated delay approach a desired level as closely as possible. This prevents the reduction of the number of man-hours or the number of steps needed for the integrated circuit design process.

SUMMARY OF THE INVENTION

An object of the present invention is to provide an improved integrated circuit design apparatus in which the above-described problems are eliminated.

Another object of the present invention is to provide an integrated circuit design apparatus that efficiently carries out the integrated circuit design process and avoids the necessity of the re-design or design change work.

Another object of the present invention is to provide an integrated circuit design method that efficiently carries out the integrated circuit design process and avoids the necessity of the re-design or design change work.

Another object of the present invention is to provide a computer-executable program that efficiently carries out the integrated circuit design process and avoids the necessity of the re-design or design change work.

The above-mentioned objects of the present invention are achieved by an integrated circuit design apparatus for providing a design of an integrated circuit, comprising: a block placement processing unit which performs processing of creation of a lower-rank mounting block in a higher-rank mounting block, and performs processing of creation of virtual placement regions in each of the lower-rank mounting block and the higher-rank mounting block; a functional block assignment processing unit which performs processing of assignment of functional blocks to each of the virtual placement regions provided by the block placement processing unit; and an evaluation processing unit which provides a display of a condition of the functional blocks assigned to each of the virtual placement regions of both the lower-rank mounting block and the higher-rank mounting block, in order to evaluate the condition of the assigned functional blocks.

The above-mentioned objects of the present invention are achieved by an integrated circuit design method for providing a design of an integrated circuit, comprising the steps of: performing processing of creation of a lower-rank mounting block in a higher-rank mounting block; performing processing of creation of virtual placement regions in each of the lower-rank mounting block and the higher-rank mounting block; performing processing of assignment of functional blocks to each of the virtual placement regions provided by the block placement processing unit; and providing a display of a condition of the functional blocks assigned to each of the virtual placement regions of both the lower-rank mounting block and the higher-rank mounting block, in order to evaluate the condition of the assigned functional blocks.

The above-mentioned objects of the present invention are achieved by an integrated circuit design program for causing a computer system to execute an integrated circuit design method for providing a design of an integrated circuit, the method comprising: performing processing of creation of a lower-rank mounting block in a higher-rank mounting block; performing processing of creation of virtual placement regions in each of the lower-rank mounting block and the higher-rank mounting block; performing processing of assignment of functional blocks to each of the virtual placement regions provided by the block placement processing unit; and providing a display of a condition of the functional blocks assigned to each of the virtual placement regions of both the lower-rank mounting block and the higher-rank mounting block, in order to evaluate the condition of the assigned functional blocks.

Conventionally, the mounting blocks of hundreds of thousands gates have become the processing unit in the floor planning. However, according to the integrated circuit design apparatus of the present invention, the virtual placement regions (or courts) are created in the LSI chip T and the mounting blocks P according to the circuit scale. The processing unit of the present invention is reduced to the level of tens of thousands gates or less, and the timing analyses, such as the cell ratio of the floor planning data and the path delay, can be performed with high precision.

The integrated circuit design apparatus of the present invention makes it possible that the designer realize his intended layout image in the stage of floor planning, and it becomes possible to study the cause of the timing problem, which may arise after the mounting design, in the initial design stage. Therefore, it is possible to minimize the necessity of the re-design or design change as in the conventional design device. For this reason, the integrated circuit design apparatus of the present invention can efficiently carry out the integrated circuit design process. Moreover, since the path delay is taken into consideration, it contributes to the improvement in quality of an LSI circuit.

BRIEF DESCRIPTION OF THE DRAWINGS

Other objects, features and advantages of the present invention will become apparent from the following detailed description when read in conjunction with the accompanying drawings.

FIG. 7A and FIG. 7B are diagrams for explaining displays of graph representation of the cell ratio with and without indications of power wiring and inhibition region.

FIG. 8A and FIG. 8B are diagrams for explaining a hierarchical switching display of graph representation of the cell ratio.

FIG. 9A and FIG. 9B are diagrams for explaining a grouping operation that groups two or more courts into a mounting block.

FIG. 11A, FIG. 11B and FIG. 11C are diagrams for explaining an automatic adjustment of the cell ratio by using parameter setting.

FIG. 15A, FIG. 15B and FIG. 15C are diagrams for explaining a subdivision editing operation which performs editing of subdivision courts produced by division of a single court.

DETAILED DESCRIPTION OF PREFERRED EMBODIMENTS

A description will now be given of preferred embodiments of the present invention with reference to the accompanying drawings.

Figure 1:
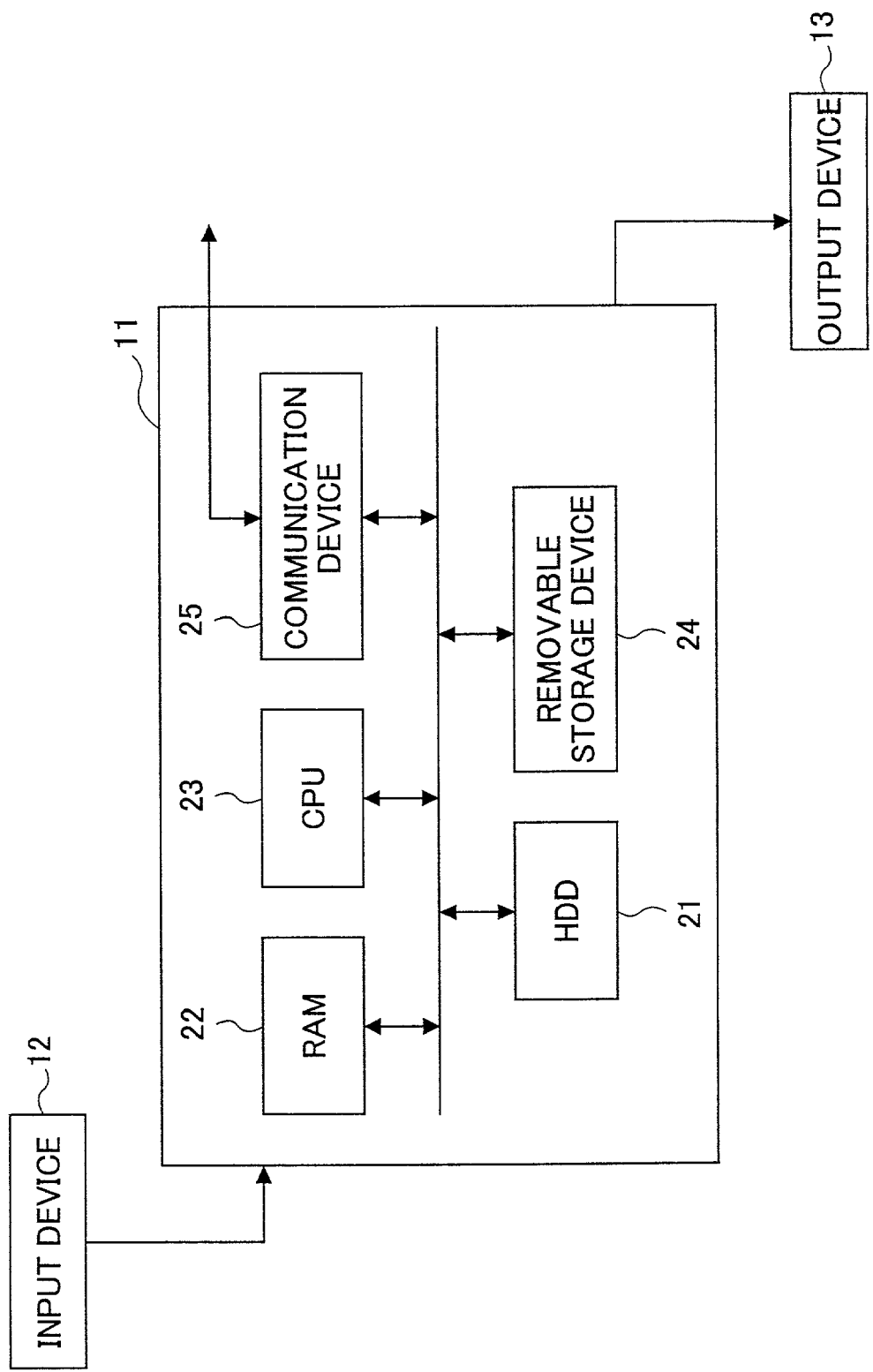
FIG. 1 is a block diagram of one embodiment of the integrated circuit design apparatus according to the present invention.

FIG. 1 shows one embodiment of the integrated circuit design apparatus according to the present invention.

As shown in FIG. 1, the integrated circuit design apparatus of the present embodiment is constructed by using a data processing device 11, an input device 12 and an output device 13. The data processing device 11 is constituted by a computer apparatus. The input device 12 is constituted by a keyboard, a mouse, etc., and inputs a command or data to the data processing device 11. The output unit 13 is constituted by a display device, and displays the contents of data processed by the data processing device 11.

The data processing device 11 generally includes a hard disk drive (HDD) 21, a RAM 22 and a CPU 23, a removable storage device 24 and a communication device 25.

The operating apparatus (OS) and the integrated circuit design program are installed in the hard disk drive 21. The operating apparatus and the integrated circuit design program, installed in the hard disk drive 21, are loaded to the RAM 22, and executed by the CPU 23. The RAM 22 provides a working memory area that is used by the CPU 23.

The removable storage device 24 is, for example, a floppy disk drive, a CD-ROM drive, a DVD-ROM drive, a MO drive, or the like. An integrated circuit design program may be provided by the floppy disk, the CD-ROM disk, the DVD-ROM disk, the MO disk or the like, and may be stored and installed in the hard disk drive 21.

The communication device 25 connects the data processing device 11 to an external device through an LAN, a telephone line, or the Internet, and performs communications with the external device. By using the communication device 25, it is possible to receive the integrated circuit design program according to the present invention through the LAN, the telephone line or the Internet, so that the received program is stored and installed in the hard disk drive 21.

Figure 2:
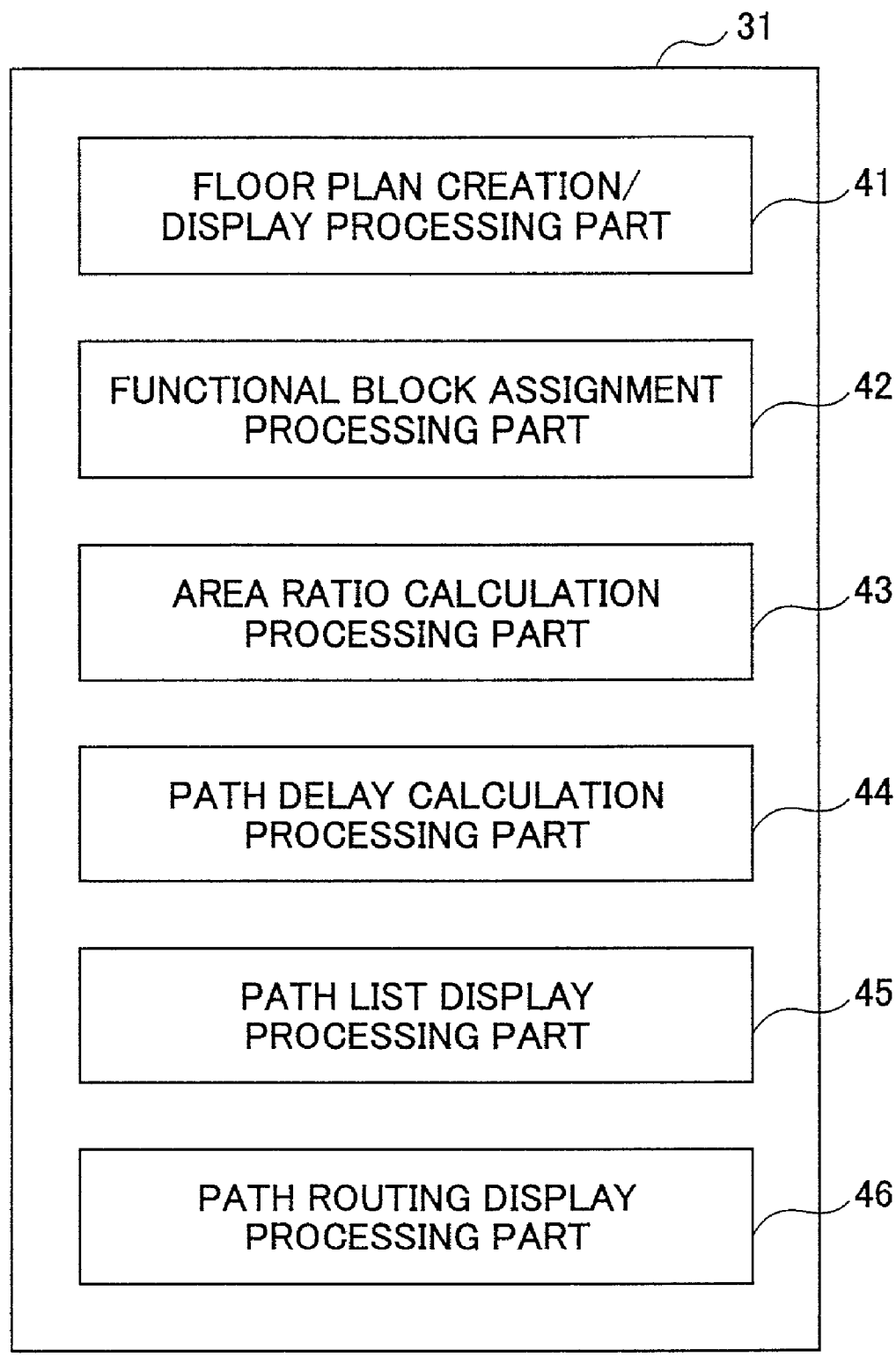
FIG. 2 is a diagram of functional blocks of the integrated circuit design program according to the present invention.

FIG. 2 shows functional blocks of the integrated circuit design program according to the present invention.

As shown in FIG. 2, the integrated circuit design program 31 generally includes a floor plan creation/display processing part 41, a functional block assignment processing part 42, an area ratio calculation processing part 43, a path delay calculation processing part 44, a path list display processing part 45, and a path routing display processing part 46.

The integrated-circuit design program 31 carries out the processing of mounting blocks, virtual placement regions (courts), functional blocks (cells), the placement of paths, the display processing, and the editing processing by using the respective functions of the above floor plan creation/ display processing part 41, the functional block assignment processing part 42, the area ratio calculation processing part 43, the path delay calculation processing part 44, the path list display processing part 45, and the path routing display processing part 46.

A description will now be provided of the definition of the functional block, the mounting block, the virtual placement region (court) and the path, which is used by the present invention.

FIG. 3A through FIG. 3D show the definition of a functional block (cell), a mounting block, a virtual placement region (court), and a path.

Figure 3A:
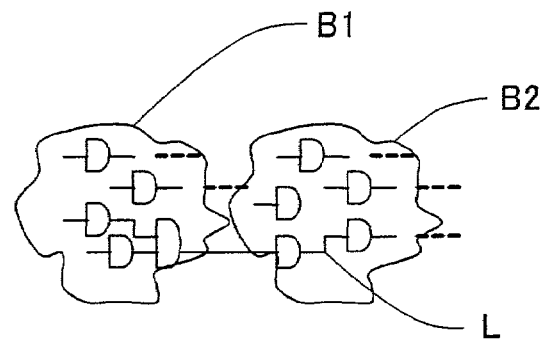
FIG. 3 is a diagram for explaining a functional block, a mounting block, a virtual placement region (court) and a path.
Figures 3B, 3C:
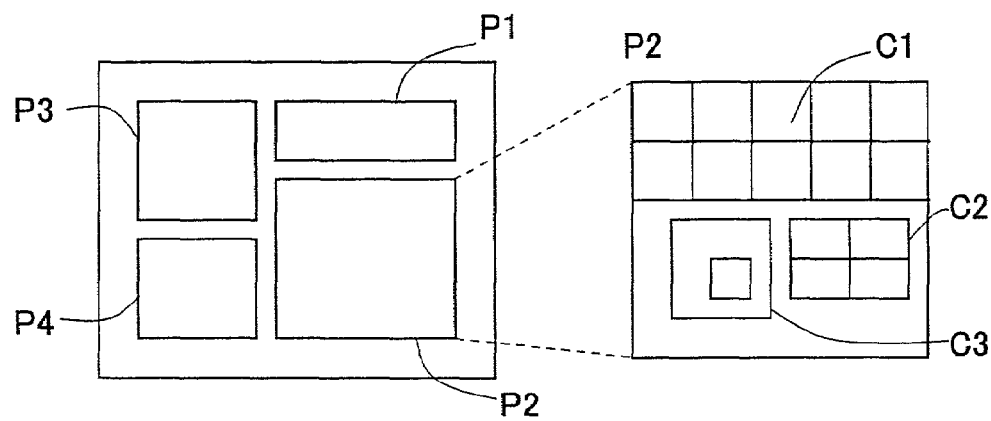
Figure 3D:
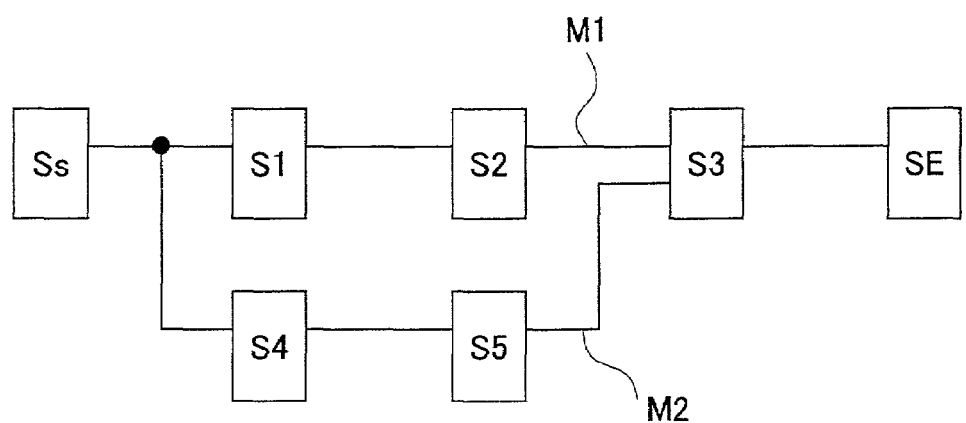

FIG. 3A indicates the definition of a functional block or cell. FIG. 3B indicates the definition of a mounting block. FIG. 3C indicates the definition of a virtual placement region (court). FIG. 3D indicates the definition of a path.

As shown in FIG. 3A, when grouping a number of logic circuit cells L into various functions, each of the cell B1 and the cell B2 is defined as being a functional block that performs one of the various functions.

As shown in FIG. 3B, when performing the integrated circuit design, an LSI chip T is divided into various mounting blocks, each of the mounting blocks P1–P4 are defined as being a region that corresponds to one of the mounting blocks into which the LSI chip T is divided.

As shown in FIG. 3C, each of the virtual placement regions C1–C3 (hereafter called the courts) is defined as being one of the regions into which the mounting block P2 is further divided.

As shown in FIG. 3D, two paths M1 and M2 are defined as the routing from the start-point cell $S_S$ to the end-point cell $S_E$. The path M1 is the route which passes along the line of the start-point cell $S_S$→the cell S1→the cell S2→the cell S3→the end-point cell $S_E$. The path M2 is the route which passes along the line of the start-point cell $S_S$→the cell S4→the cell S5→the cell S3→the end-point cell $S_E$.

With reference to the example of FIG. 3A through FIG. 3D, a description will be given of the respective functions of the integrated circuit design program 31 of FIG. 2.

In the integrated circuit design program 31 of FIG. 2, the floor plan creation/display processing part 41 performs the processing of creation of the mounting blocks P1–P4 in the LSI chip T and displaying of the resulting mounting blocks by using the input device 12 and the output device 13. The floor plan creation/display part 41 performs the processing of creation of the courts C1–C3 in each of the respective mounting blocks P1–P4 (which will be called the lower-rank mounting blocks) and displaying of the resulting courts in each mounting block (or the result of the placement) by using the input device 12 and the output unit 13. Moreover, the floor plan creation/display processing part 41 performs the processing of creation of the courts C1–C3 directly arranged in the LSI chip T (which will be called the higher-rank mounting block) and displaying of the resulting courts in the LSI chip T (or the placement result) by using the input device 12 and the output unit 13.

The functional block assignment processing part 42 performs the processing of assignment of the functional blocks or cells B1 and B2 to each of the mounting blocks P1–P4 arranged by the floor plan creation/display processing part 41, and performs the processing of assignment of the functional blocks or cells B1 and B2 to each of the courts arranged by the floor plan creation/display processing part 41. Moreover, the functional block assignment processing part 42 performs the processing of displaying of the assignment result by using the output device 13.

The area ratio calculation processing part 43 performs the processing of calculation of the cell ratio of each of the respective courts and the respective mounting blocks, and performs the processing of displaying of the cell ratio calculation result by using the output device 13. The cell ratio of a court is defined as being the ratio of an area of the assigned cells to a total area of the court. The cell ratio of a mounting block is defined as being the ratio of an area of the assigned cells to a total area of the mounting block.

The path delay calculation processing part 44 performs the processing of calculation of the path delay (e.g., wiring and logic delay) of each of the respective paths of functional blocks or cells. The path delay calculation processing part 44 compares each of the calculated path delays with a given reference value, and provides a list of the paths of functional blocks or cells the path delay of which exceeds the reference value. The path list display processing part 45 performs the processing of displaying of the list of the paths of functional blocks or cells provided by the path delay calculation processing part 44. The path routing display processing part 46 performs the processing of displaying of a path routing of the paths included in the list provided by the path delay calculation processing part 44.

A description will be given of one embodiment of the integrated circuit design method according to the present invention.

Figure 4:
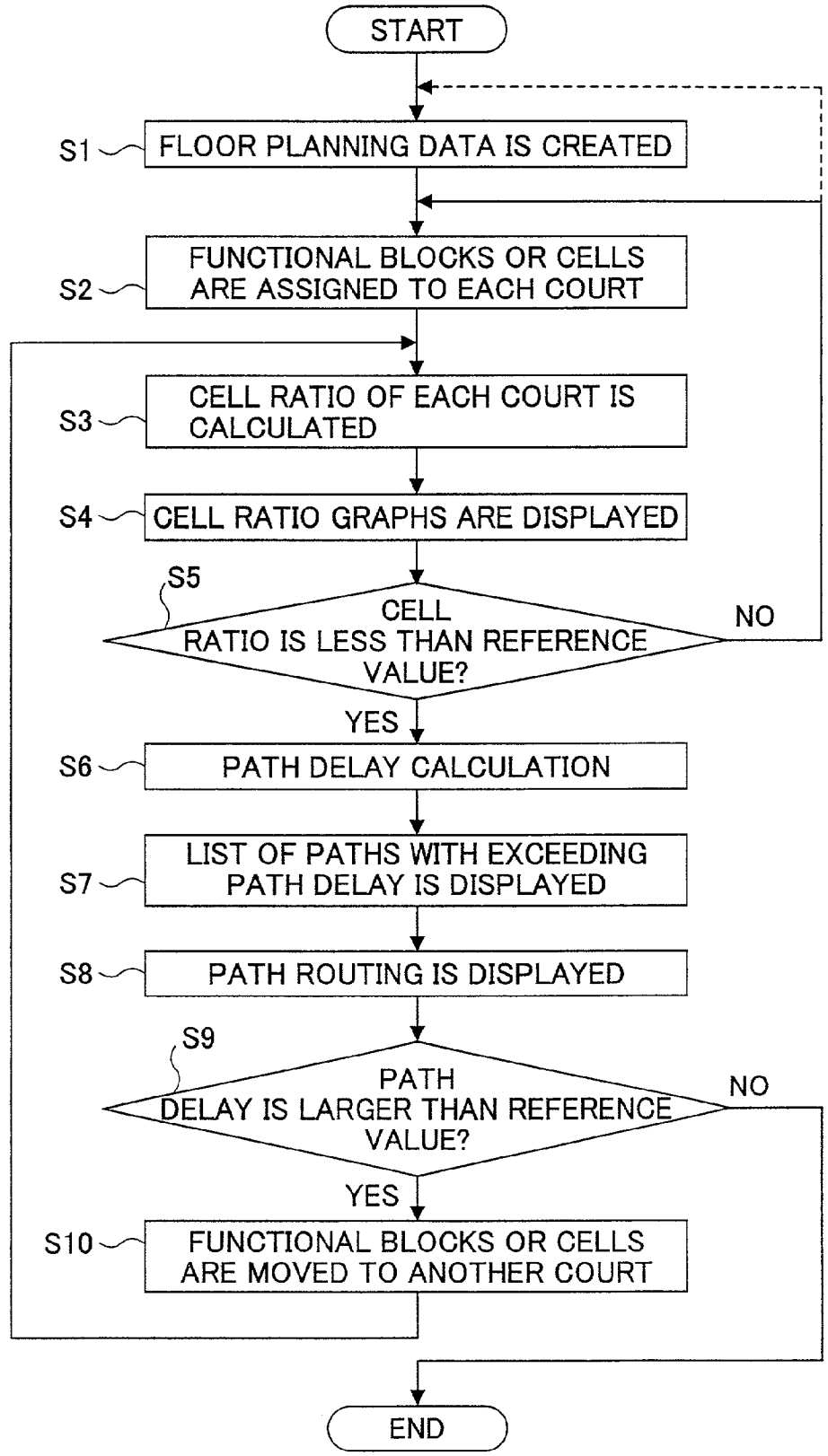
FIG. 4 is a flowchart for explaining one embodiment of the integrated circuit design method according to the present invention.

FIG. 4 is a flowchart for explaining one embodiment of the integrated circuit design method according to the present invention. This integrated circuit design method is performed by the designer using the above-mentioned integrated circuit design program 31.

At a start of the integrated circuit design method shown in FIG. 4, a floor planning data is created by using the function of the floor plan creation/display processing part 41 of the integrated circuit design program 31 (S1). At the step S1, the designer creates the mounting blocks and the courts as the floor planning data for an LSI chip by using the function of the floor plan creation/display processing part 41 as described above.

Figure 5A:
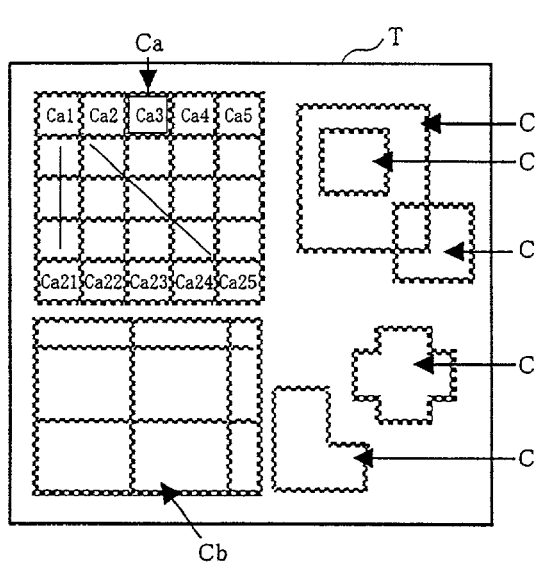
FIG. 5A, FIG. 5B and FIG. 5C are diagrams for explaining creation of mounting blocks and courts.
Figure 5B:
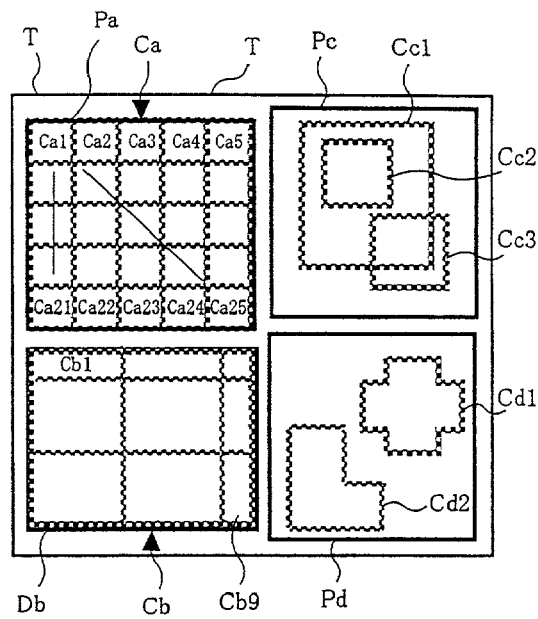
Figure 5C:
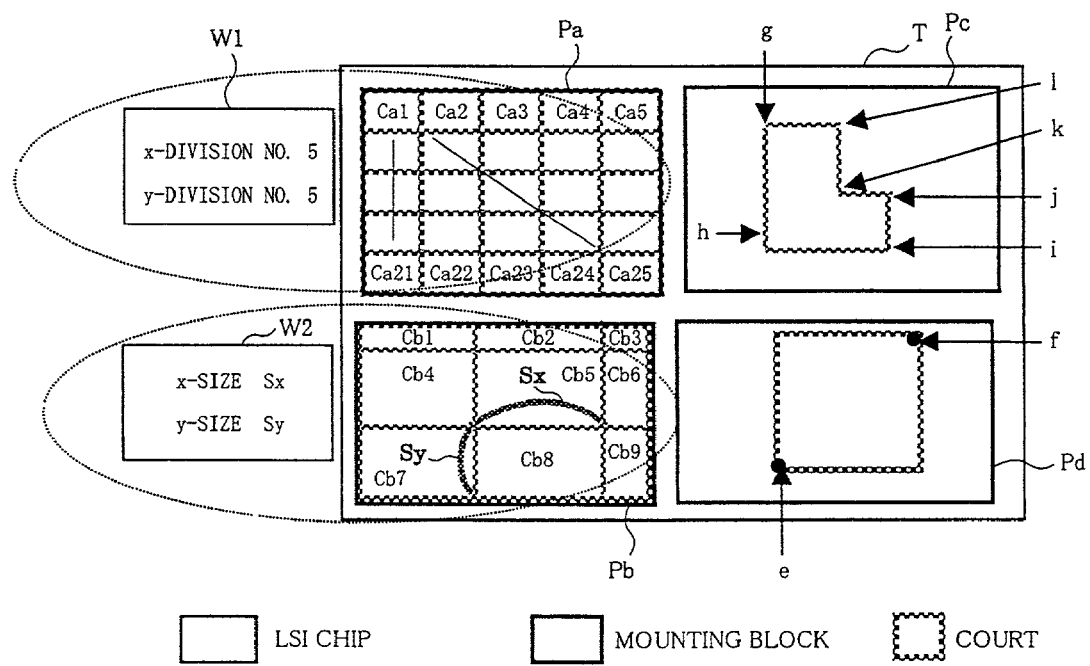

FIG. 5A, FIG. 5B and FIG. 5C show the creation of mounting blocks and courts as the floor planning data.

FIG. 5A indicates an example of definition of respective courts that are created directly in the LSI chip T. FIG. 5B indicates an example of definition of respective courts that are created in each of mounting blocks created in the LSI chip T. FIG. 5C shows a method of creation of courts.

At the step S1 of the integrated circuit design method of FIG. 4, the floor planning data is created in the following manner. As shown in FIG. 5A, in the LSI chip T, the courts Ca, Cb, Cc1–Cc3, Cd1 and Cd2 are created directly in the LSI chip T (the higher-rank mounting block). Moreover, as shown in FIG. 5B, the mounting blocks Pa-Pd (the lower-rank mounting blocks) are created in the LSI chip T, and the courts Ca are created in the mounting block Pa, the courts Cb are created in the mounting block Pb, the courts Cc1–Cc3 are created in the mounting block Pc, and the courts Cd1 and Cd2 are created in the mounting block Pd.

At this time, as shown in FIG. 5A and FIG. 5B, the floor plan creation/display processing part 41 provides the function to simultaneously create various courts with a same size, such as the courts Ca1–Ca25, and the function to create various courts having an arbitrary size, such as the courts Cc1–Cc3. Moreover, the floor plan creation/display processing part 41 provides the function to create a court in an arbitrary form that is not limited to a rectangle, such as the courts Cd1 and Cd2.

Moreover, the floor plan creation/display processing part 41 provides the function to create various courts in which one of the courts is overlaid over the other, such as the courts Cc1 and Cc2, or the function to create various courts which are overlapper each other, such as the courts Cc1 and Cc3.

Moreover, the designer selects one of the following court creation methods which are provided in the floor plan creation/display processing part 41, in order to define a court in one of the mounting blocks Pa–Pd (which is collectively called the mounting block P) or in the LSI chip T, as shown in FIG. 5C.

The first court creation method is a method of dividing the LSI chip T or the mounting block P into various courts by specifying the numerical values of x and y division numbers.

When creating courts by the first court creation method, the designer chooses the mounting block Pa or the LSI chip T which is to be divided. Next, the number of division designation window is displayed by choosing the first court creation method. For example, when the mounting block Pa is chosen, as shown in FIG. 5C, the number of division designation window "w1" is displayed near the mounting block Pa. The designer specifies the numbers of division in the x direction and the y direction of the designation window "w1". The courts Ca1–Ca25 are equally provided in the LSI chip T or the mounting block P in accordance with the numbers of division by the floor plan creation/display processing part 41.

The second coal creation method is a method of dividing the LSI chip T or mounting block P into various courts with specified sizes.

When creating courts, the designer chooses the mounting block Pa or the LSI chip T which is to be divided. Next, the division size designation window "w2" is displayed by choosing the second court creation method. For example, when the mounting block Pb is chosen, as shown in FIG. 5C, the division size designation window "w2" is displayed near the mounting block Pb. The designer specifies the size Sx in the x direction of one court, and the size Sy in the y direction within the division size designation windows "w2". The floor plan creation/display processing part 41 provides a plurality of courts each having the selected size [(Sx)×(Sy)]. At this time, the courts Pb4, Pb5, Pb7 and Pb8 with the size [(Sx)×(Sy)] are arranged, and the courts Pb1–Pb3, Pb6 and Pb9 having sizes smaller than the size [(Sx)×(Sy)] are arranged in the remaining portion of the mounting block Pb.

The third court creation method is to create a court in the shape of an arbitrary rectangle by using the input device 12, such as a mouse. For example, by dragging the mouse and moving the pointer from the point e to the point f, which are diagonal points of the rectangle as in the mounting block Pd of FIG. 5C, the court Cd is thus provided.

The fourth court creation method is to create a court in an arbitrary shape and size by using the input device 12, such as a mouse. For example, as shown in the mounting block Pc of FIG. 5C, the pointer is moved with the mouse, and the point g, the point h, the point i, the point j, the point k, and the point l are specified by clicking. The figure that is created by connecting the specified points g, h, i, j, k and l in straight lines is provided as the court.

By performing one of the above-described methods, the courts C are created in the LSI chip T (the higher-rank mounting block) as well as in the respective mounting blocks P (the lower-rank mounting blocks).

According to the integrated circuit design method of the present embodiment, as shown in FIG. 4, after the step S1 is performed, the functional blocks or cells are assigned to the respective courts of each of the LSI chip T and the mounting blocks P (S2). At the step S2, for example, certain functions are defined to each of the courts, and the functional blocks or cells that carry out the functions are automatically assigned to the court of concern.

After the functional blocks or cells are assigned to each of the courts at the step S2, the cell ratio of each court (or the cell ratio of each mounting block) is calculated in accordance with the following formula (S3):

cell ratio=(sum of areas of functional blocks or cells)/(total area of court or mounting block)× 100(%).

After the cell ratios of all the courts (or the mounting blocks) are calculated at the step S3, a graph representation of the cell ratio for each court (or each mounting block) is displayed (S4).

Figure 6:
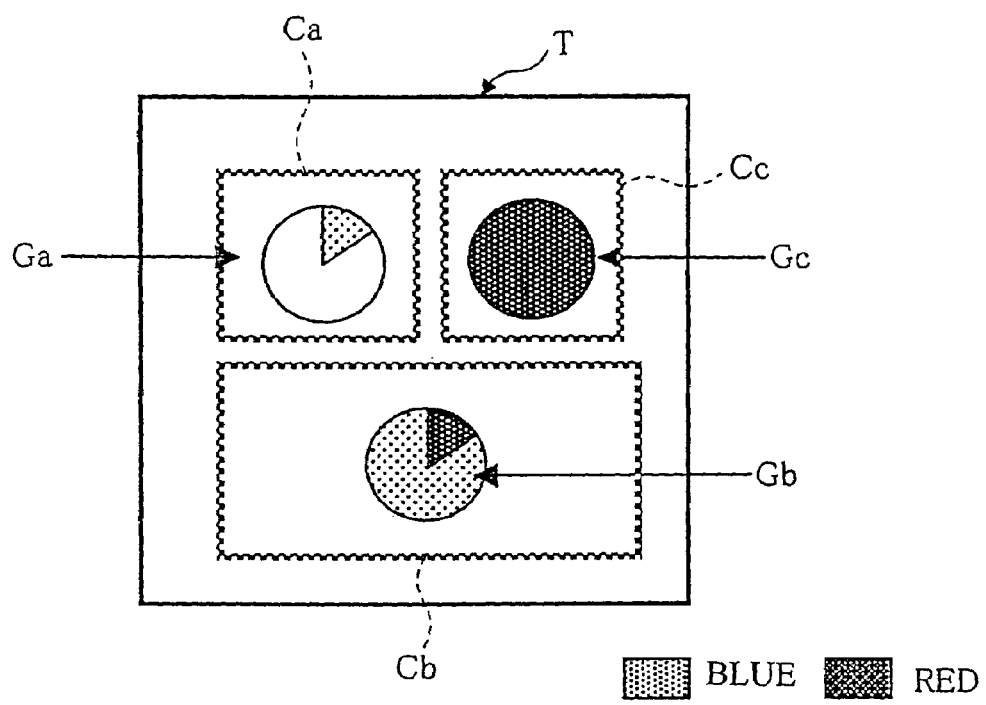
FIG. 6 is a diagram showing a display of graph representation of the cell ratio of a court.

FIG. 6 shows a display of graph representation of the cell ratio of a court.

In FIG. 6, the cell ratio of each of the courts Ca, Cb and Cc is displayed in the pie-chart representation Ga, Gb and Gc for every court. In the case of the court Ca, the graph representation indicates that the cell ratio is below 100%. For example, in the graph representation Ga of the court Ca, the part of the court where the cells are arranged is displayed in blue (dotted pattern), and the remaining part of the court where no cells are arranged is displayed in white.

Moreover, in the case of the court Cb, the graph representation shows that the cell ratio is above 100%. For example, in the graph representation Gb of the court Cb, the part of the cell where the cell ratio exceeds 100% is displayed in a given color (e.g., red), which is different from blue, and in a given pattern (e.g., checked pattern), which is different from the dotted pattern.

Furthermore, in the case of the court Cc, the graph representation indicates that the cell ratio is above 200%. For example, all of the graph representation Gc of the court Cc is displayed in red (checked pattern). Alternatively, the graph representation in the case where the cell ratio exceeds 200% may be provided in a different color (other than blue or red) and in a different pattern (other than dotted or checked pattern).

The cell ratio of each of the courts Ca, Cb and Cc can be recognized by the designer by referring to the above-mentioned cell ratio graphs Ga, Gb and Gc that are displayed at the step S4. At the step S5 of the integrated circuit design method of FIG. 4, it is determined whether the cell ratio of each of the courts Ca, Cb and Cc is smaller than a given reference value, based on the displayed cell ratio graphs Ga, Gb and Gc. When it is determined that the cell ratio is not smaller than the reference value, the design process is returned to the step S1 or the step S2. Then, the placement of the mounting blocks, the courts, and the cells, and the size adjustment are performed such that the cell ratio of each of the courts is smaller than the reference value.

Next, a description will be given of the placement of the mounting blocks P, the courts C and the cells B, and the size adjustment.

In order to perform the adjustment correctly, the integrated circuit design apparatus of the present embodiment is provided with a cell ratio displaying function to display a graph representation of the cell ratio of each of the respective courts which cell ratio is calculated by taking into consideration the region where the placement of cells in the court is inhibited. The cell ratio displaying function may be provided to selectively display one of the cell ratio graphs with and without indications of power wiring and inhibition region.

FIG. 7A and FIG. 7B show displays of graph representation of the cell ratio with and without indications of power wiring and inhibition region.

FIG. 7A indicates a display of graph representation (Ga, Gb and Gc) of the calculated cell ratios of the respective cells Ca, Cb and Cc with indications of power wiring and inhibition region. The belt-like indications of the power wiring and the inhibition region are provided within each of the respective courts Ca, Cb and Cc. The power wiring indications are to indicate the location where the wiring of the power supply is arranged in the court. The inhibition region indications are to indicate the location where the placement of cells in the court is inhibited. FIG. 7B indicates a display of graph representation (Ga, Gb and Gc) of the cell ratios of the respective cells without the indications of the power wiring and the inhibition region.

When switching from one of the two displays to the other, the designer clicks a switching button that is displayed within the display screen of the output device 13. In addition, the display method for the indications of the power wiring and the inhibition region is not limited to the belt-like representation in the above embodiment.

Moreover, the integrated circuit design apparatus of the present embodiment is equipped with a hierarchical switching display function to selectively display one of the cell ratio graphs of a higher-rank mounting block and a lower-rank mounting block.

FIG. 8A and FIG. 8B show a hierarchical switching display of graph representation of the cell ratio that is switched between a higher-rank mounting block and a lower-rank mounting block.

FIG. 8A shows a display of graph representation (Ga, Gb and Gc) of the individual cell ratios of the respective courts Ca, Cb and Cc which are temporarily arranged in the lower-rank mounting block. FIG. 8B shows a display of graph representation ($G_T$ or $G_P$) of the total cell ratio of the higher-rank mounting block that is either the LSI chip T or the mounting block P.

When switching from one of the two displays to the other, the designer clicks a hierarchical switching button that is displayed within the display screen of the output device 13. For example, if the designer clicks the hierarchical switching button when the cell ratio graphs Ga, Gb and Gc are displayed for every courts Ca, Cb and Cc in the lower-rank mounting block as shown in FIG. 8A, the total cell ratio graph GT of the LSI chip T or the mounting block P will be displayed.

Moreover, the integrated circuit design apparatus of the present embodiment is equipped with a grouping function to group various courts into a mounting block.

FIG. 9A and FIG. 9B show a grouping operation that groups various courts into a mounting block and creates the mounting block.

FIG. 9A indicates the condition of the mounting block (the LSI chip T) before the grouping operation. FIG. 9B indicates the condition of the mounting block after the grouping operation.

As shown in FIG. 9A, plural courts including the courts Ca, Cb and Cc are arranged on the LSI chip T. The designer chooses the courts Ca, Cb, and Cc that are to be grouped into a mounting block. When the courts Ca, Cb and Cc are chosen, the floor plan creation/display processing part 41 creates the mounting court P in which the courts Ca, Cb and Cc are arranged as shown in FIG. 9B.

Moreover, in order to provide an easy editing operation, it is appropriate that the integrated circuit design apparatus of the present embodiment is equipped with the display function to display the court information for each of the courts contained in the mounting block being created.

Figure 10A:
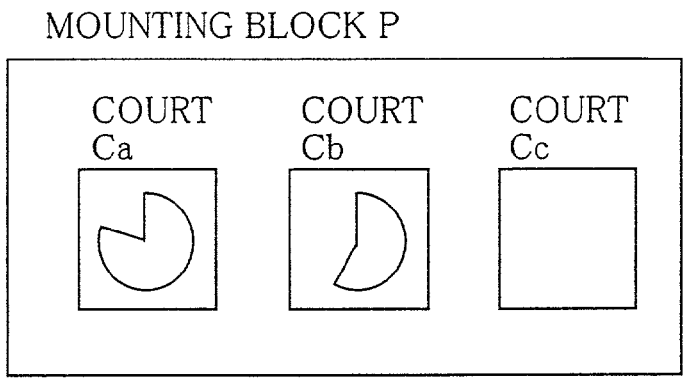
FIG. 10A, FIG. 10B and FIG. 10C are diagrams for explaining a display of court information.
Figure 10B:
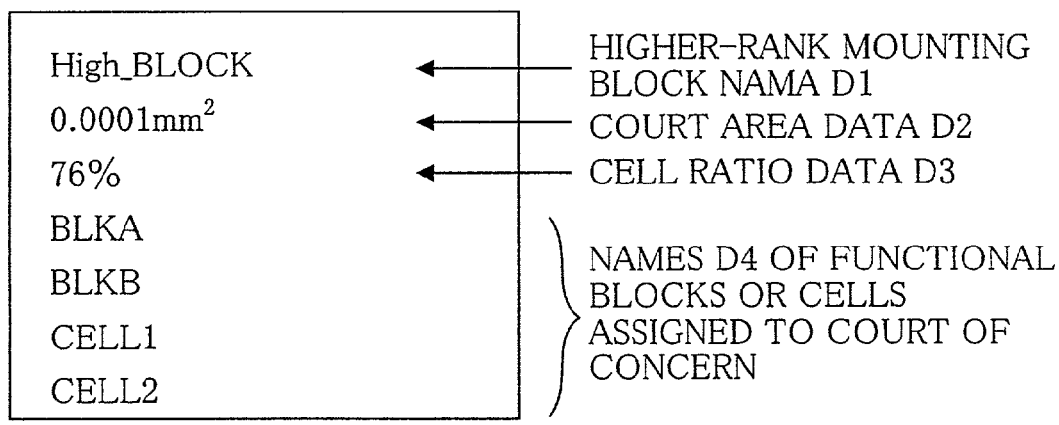
Figure 10C:
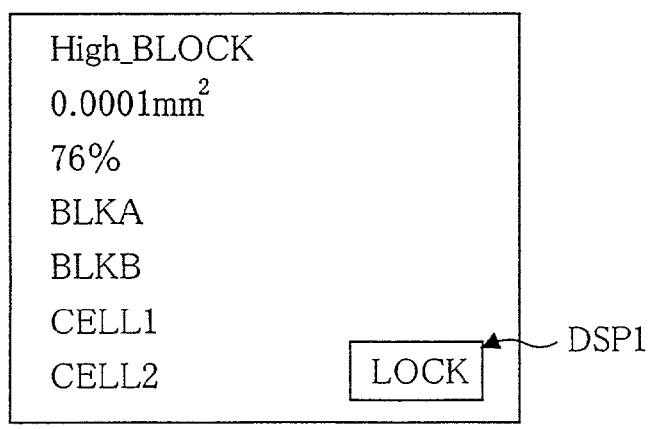

FIG. 10A, FIG. 10B and FIG. 10C show a display of court information.

FIG. 10A indicates a display of a mounting block P in which the courts Ca, Cb and Cc are defined. FIG. 10B indicates a list of the court information assigned to the court Ca. FIG. 10C indicates a list of the court information assigned to the court Ca in which a lock indication DSP1 is displayed.

On the display screen of FIG. 10A, the three courts Ca, Cb, and Cc defined in the mounting block P are displayed. If the designer moves the pointer on the court Ca, the court information of the court Ca appears as shown in FIG. 10B.

The court information of the court Ca includes the higher-rank mounting block name D1, the court area data D2, the cell ratio data D3, and the names D4 of the functional blocks or cells assigned to the court Ca. The designer can detect the details of the court information of the court Ca from the display screen of FIG. 10B.

In addition, the display screen of FIG. 10B appears when the pointer is located at the court Ca on the display screen of FIG. 10A. If the pointer is moved to another location, the display screen of FIG. 10B will disappear. However, there is a case where the designer wishes to hold the court information D1–D4 of the court Ca on the display screen of FIG. 10B in order to utilize it in performing various editing and evaluation operations related to court Ca. In such a case, the designer presses a predetermined key of the keyboard of the input device 12, for example, the "Z" key, in order to hold the court information on the display screen of FIG. 10B. The lock indication DSP1 is displayed within the list of the court information of the court Ca as shown in FIG. 10C. In this case, even if the pointer is moved to another location, the court information continues to be held.

At this time, the lock indication DSP1 is displayed on the court information screen shown in FIG. 10C. With the lock information DSP1, the designer is notified that the court information of the court Ca is held. Moreover, in this condition, if the designer presses a predetermined key of the keyboard of the input device 12, for example, the "ESC" key, this causes the display screen of FIG. 10C to disappear.

The designer can advance the integrated circuit design process and recognize the conditions of various courts or the surrounding situations. Specifically, the designer can perform the integrated circuit design with reference to the court information screen where the detailed court information for each court is displayed, and, it is possible to increase the efficiency of the integrated circuit design. Moreover, it is possible to prevent the necessity of the re-design or design change work as in the conventional integrated circuit design device.

Furthermore, in order to raise the workability of the integrated circuit design process, the integrated circuit design apparatus of the present embodiment is provided with an automatic court generation function and an automatic cell ratio adjustment function.

The integrated circuit design apparatus of the present embodiment calculates the court area $S_C$ by setting the parameters which determine the area of the court of concern, such as the target cell ratio $O_T$, the margin degree R, and the gate area $S_L$. The parameters are externally specified from the outside. In addition, unless otherwise specified, the default value is used. However, the priority is established between the parameters. For example, in a case where the target cell ratio and the degree of margin are specified, a higher priority is given to the target cell ratio.

Specifically, the integrated circuit design apparatus of the present embodiment calculates the court area $S_C$ by setting the parameters in accordance with the following formulas:

When the target cell ratio $S_L$ is applied, $$S_C = S_L \times 100/O_T \quad (1)$$

When the margin degree R is applied, $$S_C = S_L \times R \quad (2)$$

Based on the calculations of the court area according to the above formulas (1) and (2) and the aspect ratio of the court (which is 1:1 when unspecified), the integrated circuit design apparatus of the present embodiment automatically generates the court.

FIG. 11A, FIG. 11B and FIG. 11C show an automatic adjustment of the cell ratio by using parameter setting.

FIG. 11A indicates the condition of a court before the automatic adjustment. FIG. 11B indicates the display of a parameter setting screen. FIG. 11C indicates the condition of the court after the automatic adjustment.

As shown in FIG. 11A, the court has an equal length (L) in the vertical direction and the horizontal direction, respectively and the cell ratio of the court is 50%. Namely, the aspect ratio of the court is one to one (1:1). In order to reduce the cell ratio to 40% without changing the functional blocks or cells assigned to the court, it is necessary to change the size of the court. The designer selects the mode to set the parameters of the cell ratio, and the parameter setting screen is displayed as shown in FIG. 11B. The designer selects the box indicated by "CELL RATIO" in the parameter setting screen of FIG. 11B, and specifies the cell ratio box to the value "40". The area of the court is calculated in accordance with the above formula (1). Then, an enlarged rectangle that is created based the calculated area and the aspect ratio of the court is displayed. In the present example, the aspect ratio of the court is one to one. As shown in FIG. 11C, the enlarged court has an equal length $\frac{5}{4} \times L$ in the vertical direction and the horizontal direction, respectively. This adjustment is automatically performed, and the cell ratio of the court after the automatic adjustment becomes 40%.

Accordingly, it is possible for the integrated circuit design apparatus of the present embodiment to generate the court having a desired cell ratio by setting the cell ratio to a desired value as mentioned above.

Moreover, in order to provide efficient designing, the integrated circuit design apparatus of the present embodiment is equipped with a logic assignment movement function to move functional blocks or cells from one court to another.

FIG. 12A through FIG. 12D show a movement operation that moves functional blocks or cells from one court to another.

Figure 12A:
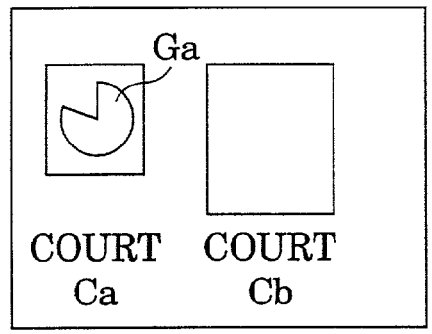
FIG. 12A, FIG. 12B, FIG. 12C and FIG. 12D are diagrams for explaining a movement operation that moves functional blocks or cells from one court to another.
Figure 12B:
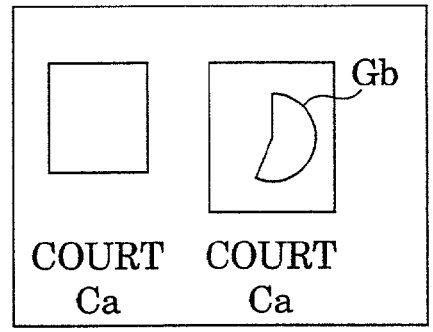
Figure 12C:
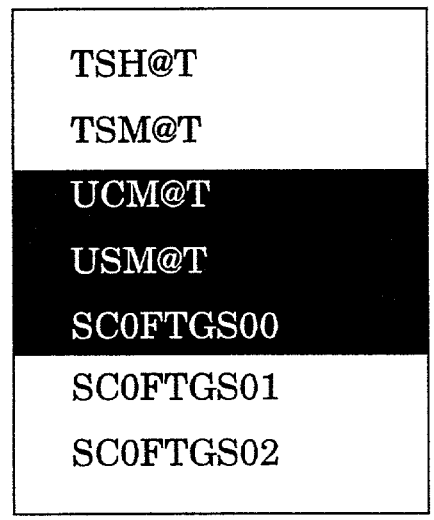
Figure 12D:
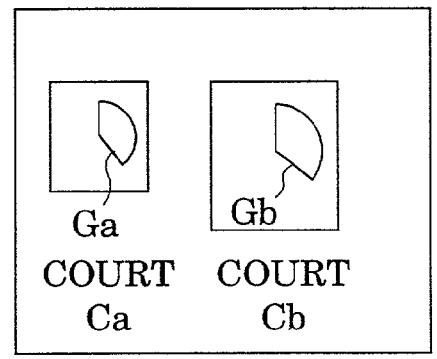

FIG. 12A indicates the condition of a mounting block before the movement operation. FIG. 12B indicates the condition of the mounting block after the logic assignment of the court Ca is completely moved to the court Cb. FIG. 12C indicates a list of the logic assignment of the court Ca. FIG. 12D indicates the condition of the mounting block after the logic assignment of the court Ca is partially moved to the court Cb.

The functional blocks or cells are assigned to the court Ca with the cell ratio as in the graph Ga of FIG. 12A. There is no logic assignment with respect to the court Cb. In addition, the size of the court Cb is set as being larger than the size of the court Ca.

In order to move all the functional blocks or cells that are assigned to the court Ca to the court Cb, the designer chooses a move command, and chooses the source court Ca and the destination court Cb in this order. By performing the above operations, all the functional blocks or cells of the court Ca are moved to the court Cb. As the size of the court Cb is larger than the size of the court Ca, even if all the functional blocks or cells of the court Ca are moved to the court Cb, the cell ratio of the destination court Cb is smaller than that of the source court Ca.

When moving some of the functional blocks or cells which are assigned to the court Ca to the court Cb, the designer makes use of the logic assignment list shown in FIG. 12C. If the designer chooses a move command and chooses the source court Ca in the condition shown in FIG. 12A, the logic assignment list of the court Ca, including the functional blocks or cells, appears as shown in FIG. 12C.

The designer chooses the functional blocks or cells, which are to be moved, from the logic assignment list. As shown in FIG. 12C, the reversal indication of the selected functional blocks or cells is given.

Next, when the destination court Cb is chosen, the functional blocks or cells specified in the logic assignment list are moved to the court Cb. After the functional blocks or cells specified in the logic assignment list are moved to the court Cb from the court Ca, the cell ratio of the court Ca is decreased while the cell ratio of the court Cb is increased as shown in FIG. 12D.

In the present embodiment, the logic assignment can be exchanged between different courts, if needed, and the integrated circuit design apparatus of the present embodiment can easily adjust the cell ratio of each court and increase the efficiency of integrated circuit designing.

Moreover, the integrated circuit design apparatus of the present embodiment is provided with a canceling function to cancel the assignment of functional blocks or cells to one court.

Figure 13A:
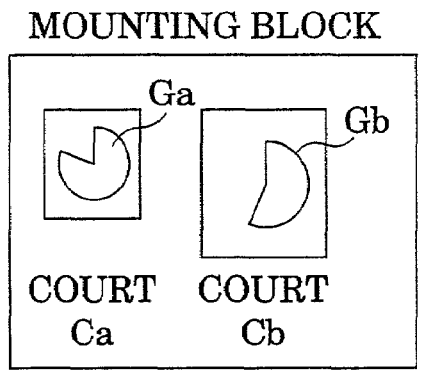
FIG. 13A, FIG. 13B, FIG. 13C and FIG. 13D are diagrams for explaining a canceling operation that cancels the assignment of functional blocks or cells to a court.
Figure 13B:
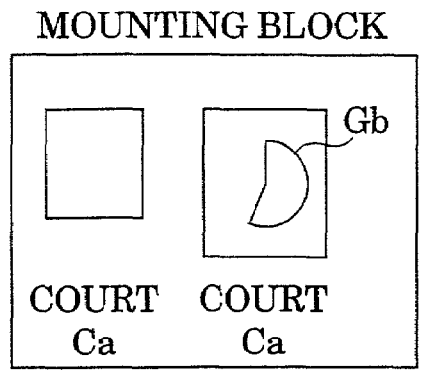
Figure 13C:
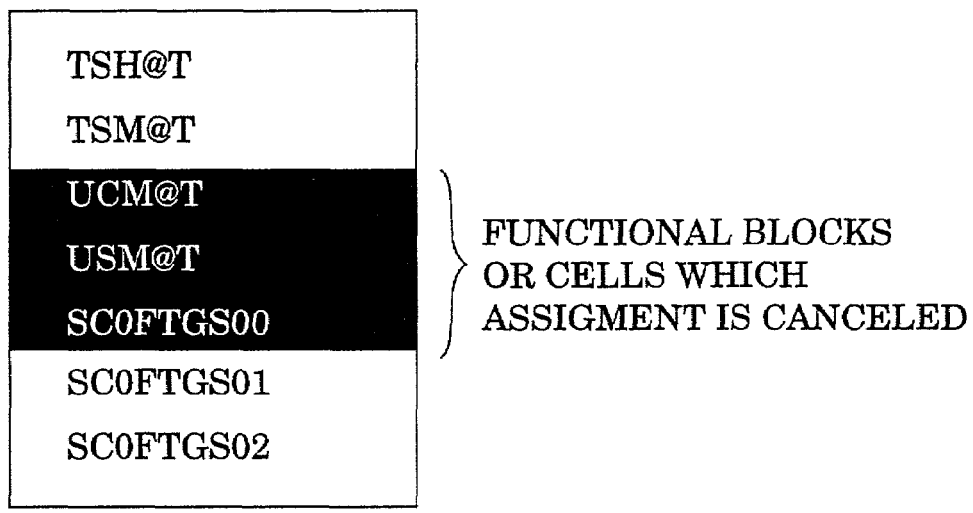
Figure 13D:
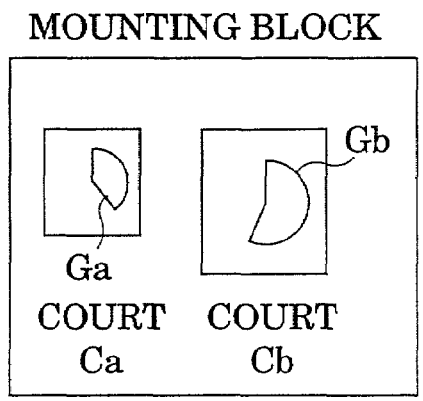

FIG. 13 through FIG. 13D show a canceling operation that cancels the assignment of functional blocks or cells to a court.

FIG. 13A indicates the condition of a mounting block before the assignment is canceled. FIG. 13B indicates the condition of the mounting block after the logic assignment to the court Ca is completely canceled. FIG. 13C indicates a list of the logic assignment to the court Ca. FIG. 13D indicates the condition of the mounting block in which the logic assignment to the court Ca is partially canceled.

In order to cancel all the logic assigned to the court Ca, the designer chooses a cancel command, and then double-clicks the court Ca with the mouse. At this time, all the functional blocks or cells of the court Ca are canceled as shown in FIG. 13B.

Moreover, when canceling some of functional blocks or cells which are assigned to the court Ca, the designer makes use of a logic assignment list. If the cancel command is chosen and the court Ca is chosen in the condition shown in FIG. 13A, then the logic assignment list shown in FIG. 13C appears. The designer chooses from the logic assignment list the functional blocks or cells which are to be canceled. As shown in FIG. 13C, the reversal indication of the selected functional blocks or cells is given. Next, if the court Ca is clicked, only the functional blocks or cells specified in the logic assignment list are canceled. As shown in FIG. 13D, the cell ratio of the court Ca is reduced, and it is displayed.

Accordingly, the functional blocks or cells assigned to a specific court can be canceled completely or partially, if needed, and the integrated circuit design apparatus of the present embodiment can increase the efficiency of integrated circuit designing.

Figure 14A:
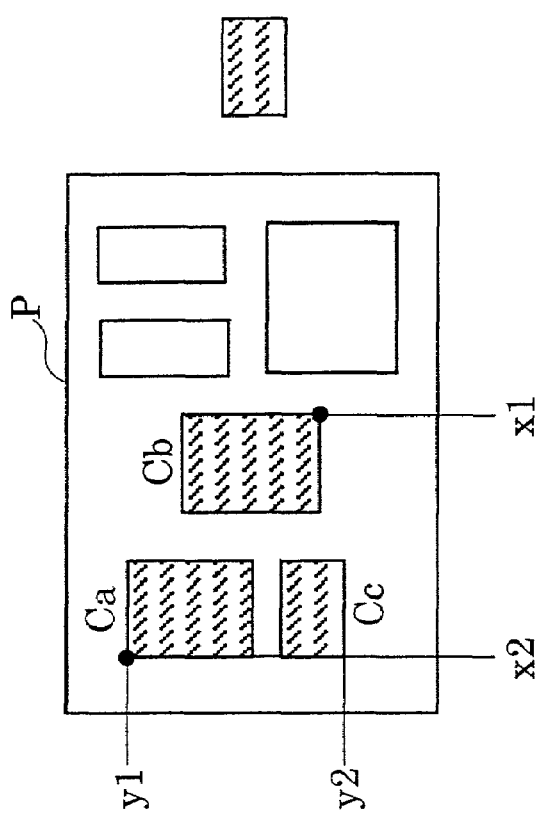
FIG. 14A and FIG. 14B are diagrams for explaining a coupling operation that couples two or more courts together.
Figure 14B:
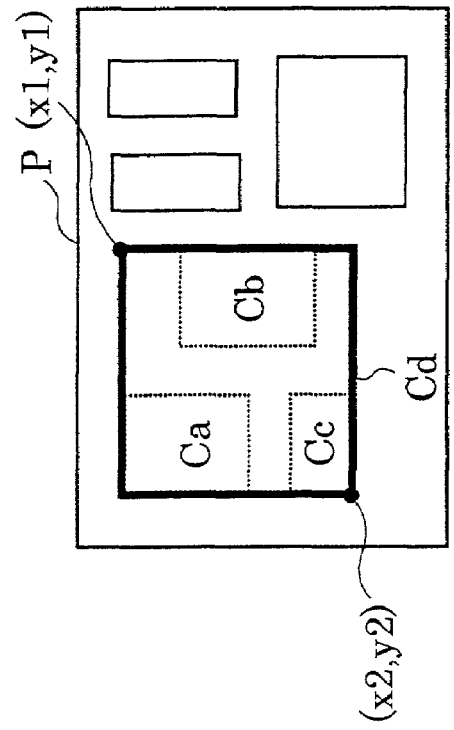

FIG. 14A and FIG. 14B show a coupling operation that couples two or more courts together.

FIG. 14A indicates the condition of the mounting block P before the coupling operation, and FIG. 14B shows the condition of the mounting block P after the coupling operation.

Suppose that the functional blocks and the cells are assigned to various courts including the courts Ca, Cb, and Cc in the mounting block P.

When coupling the three courts Ca, Cb, and Cc in the mounting block P into a single court, the designer chooses a couple command, and then chooses the courts Ca, Cb, and Cc which are to be coupled together. At this time, the maximum coordinates (x1, y1) and the minimum coordinates (x2, y2) are detected from among the peak coordinates of the respective selected courts, and it considers as the new court Cd after combining the rectangle region which made the two points the peak. In addition, the functional blocks or cells, which are assigned to the courts Ca, Cb, and Cc before the coupling, are assigned to the new court Cd.

Moreover, the integrated circuit design apparatus of the present embodiment is provided with a subdivision editing function to perform editing of subdivision courts produced by division of a single cell.

Figures 15A, 15C:
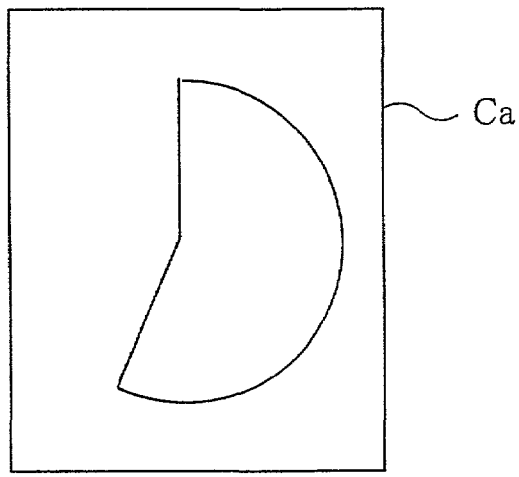

FIG. 15A, FIG. 15B and FIG. 15C show a subdivision editing operation which performs editing of subdivision courts produced by division of a single court.

FIG. 15A indicates the condition of a single court in which the logic assignment is performed but the subdivision is not yet performed. FIG. 15B indicates the condition of the court which is subdivided into 3×3 subdivision courts. FIG. 15C indicates the condition of the subdivision courts in which the graph representation of the cell ratio of each of some subdivision courts is displayed.

When carrying out the subdivision rate of the single court Ca shown in FIG. 15A to two or more courts Ca1–Ca9, a designer chooses a division command first. Next, the number of division in every direction or the length of a court in every direction is specified.

Specification of the number of division of the direction of length of a court and the number of division of a transverse direction carries out the subdivision rate of the court Ca to nine courts Ca1–Ca9, as shown in FIG. 15B.

When the functional block is assigned to the original court at this time, by using algorithm, such as level sorting of a path, in a front division court, as shown in FIG. 15B, it asks for the virtual placement position of the cells B1–B9 arranged in court Ca, and cells B1–B9 are assigned to the court after division near a virtual placement position. Thereby, cells B1–B9 are assigned to each of the division courts Ca1–Ca9. The cell ratio of each of the division courts Ca1–Ca9 is computed by the assigned functional block, and the graphs Ga2, Ga3, Ga5 and Ga7 in which the cell ratio is shown as shown in FIG. 15C are displayed.

Moreover, in this case of the operation, it considers as the composition which can rectify easily the projection from the overlap between courts, and a mounting block.

Figure 16A:
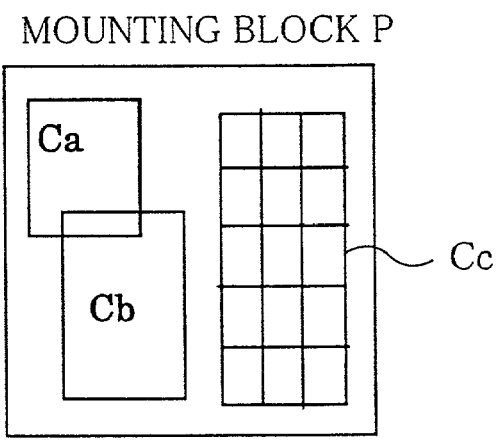
FIG. 16A, FIG. 16B and FIG. 16C are diagrams for explaining a correction operation that corrects the overlapping of courts and the projection of courts from a mounting block.
Figure 16B:
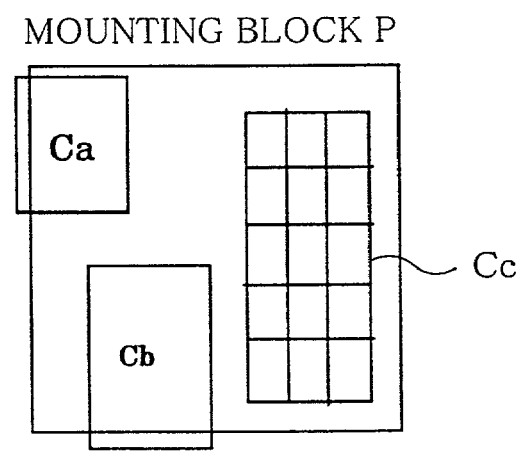
Figure 16C:
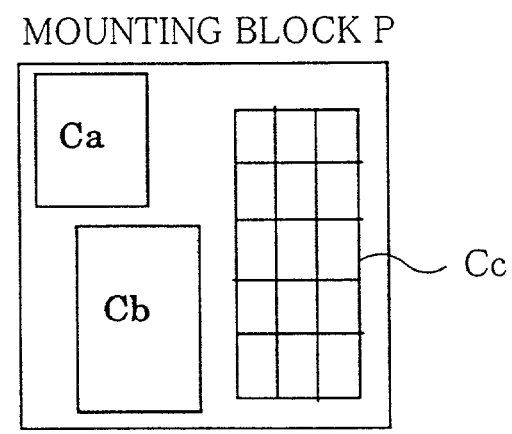

FIG. 16A, FIG. 16B and FIG. 16C show a correction operation that corrects the overlapping of courts and the projection of courts from a mounting block.

FIG. 16A indicates the condition in which the courts Ca and Cb are overlapped. FIG. 16B indicates the condition in which the courts Ca and Cb project from the mounting block P. FIG. 16C indicates the condition in which the overlapping or the projection is corrected so that the courts Ca and Cb are contained in the mounting block P.

In the condition of FIG. 16A, the courts Ca and Cb are overlapped. In order to cancel the overlapping of the courts Ca and Cb, the designer manually moves the courts Ca and Cb as shown in FIG. 16B. Suppose that, in this example, the courts Ca and Cb partially project from the edges of the mounting block P, and the physical justification is lost. In such a case, the designer chooses a check command for performing the checking function, and the overlapping condition of the mounting block P and the courts Ca and Cb is checked. The positions of the courts Ca and Cb are adjusted automatically, as shown in FIG. 16C, and the projection of the courts Ca and Cb from the mounting block P is canceled.

Moreover, with the use of the floor plan creation/display processing part 41 of the present embodiment, it is possible to easily perform the placement of cells on each path.

FIG. 17A through FIG. 18B show the placement of cells on a path of a functional block.

Figure 17A:
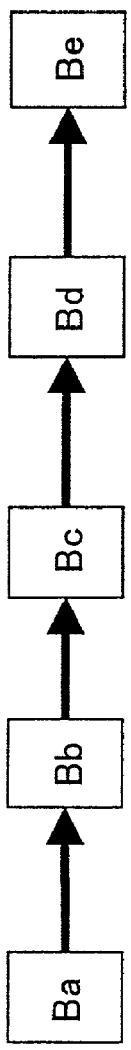
FIG. 17A and FIG. 17B are diagrams for explaining the placement of cells on a path of a functional block.
Figure 17B:
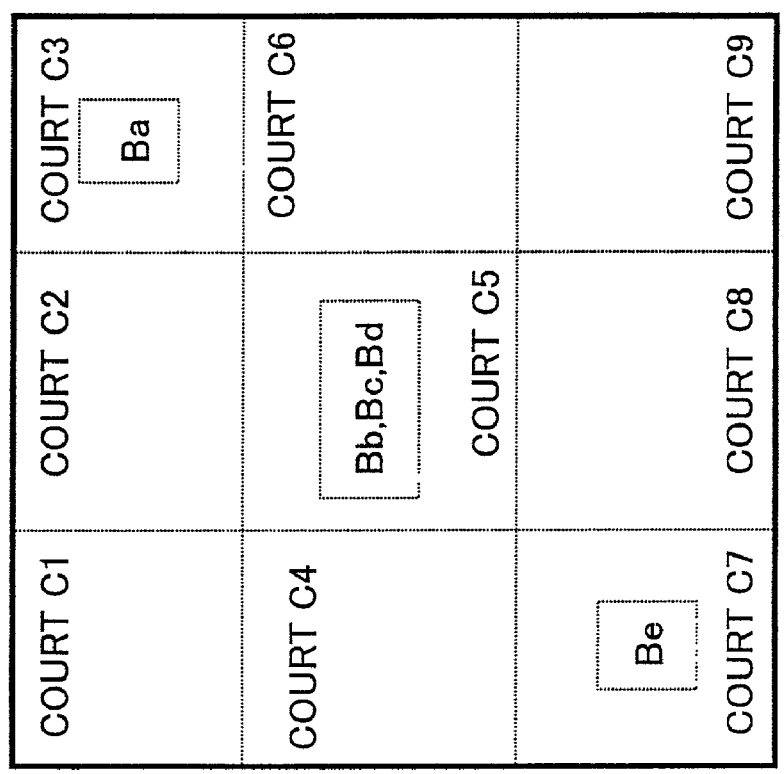
Figure 18A:
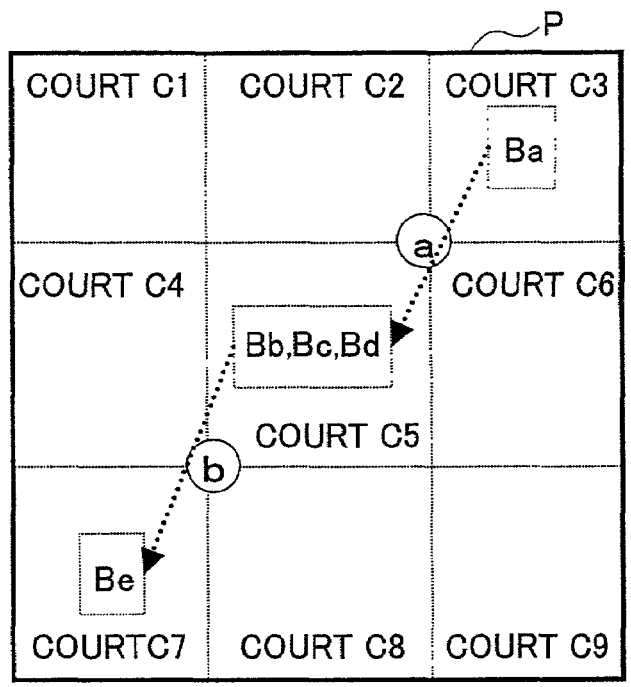
FIG. 18A and FIG. 18B are diagrams for explaining the placement of the cells on the path of the functional block.
Figure 18B:
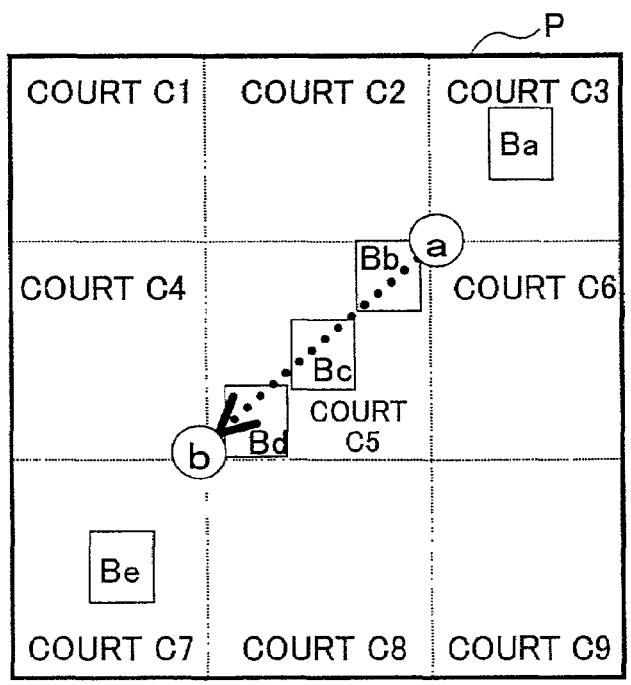

FIG. 17A indicates a path in which cells Ba through Be are arrayed. FIG. 17B indicates the placement of the cells Ba through Be in the functional block. FIG. 18A indicates the condition of the function block in which the points a and b are selected. FIG. 18B indicates the placement method of the cells Bb, Bc and Bd.

As shown in FIG. 17A, the cells Ba–Be are connected in order of Ba→Bb→Bc→Bd→Be. As the cells Ba–Be are shown in FIG. 17B, the cell Be is assigned to the court C7, and cell Bb–Bd is assigned for cell Ba to the court C3 on the court C5.

The peak a with the court C3 and the peak b of the court C7 where the path which ties the court C3 where the functional block Ca of the start of the path is assigned, and the court C7 where the functional block Ce of the end of the path is assigned becomes the shortest are chosen as a passage coordinates point. The virtual placement of the cell Ba which serves as the starting point of a path as shown in FIG. 18A is carried out in the center of the court C3, and the virtual placement of the cell Be used as the terminal point of the path is carried out in the center of the court C7.

Moreover, the line segment to which the cells Bb, Bc and Bd prepared in the court C5 through which the path passes through the route a and the route b as shown in FIG. 18B. The virtual placement is made at equal intervals from the start-point side up at the end-point side.

Next, a description will be given of the virtual placement method of cells on branching paths.

FIG. 19A through FIG. 21 show the placement of cells on branching paths.

Figure 19A:
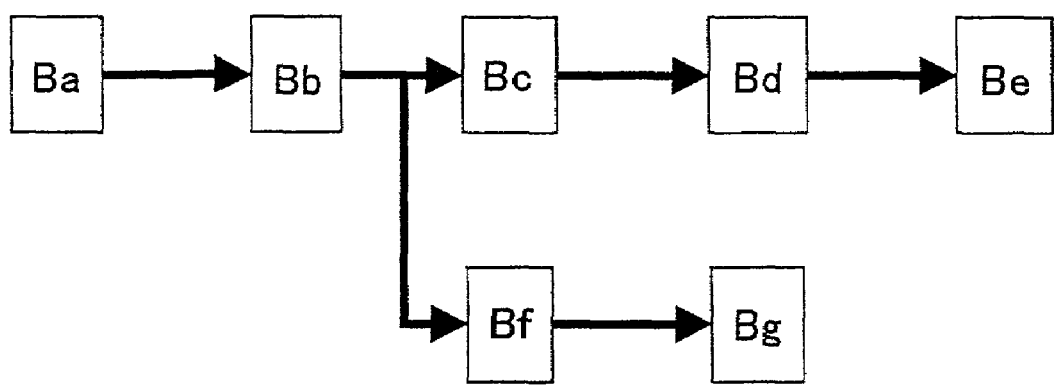
FIG. 19A and FIG. 19B are diagrams for explaining the placement of cells on branching paths.
Figure 19B:
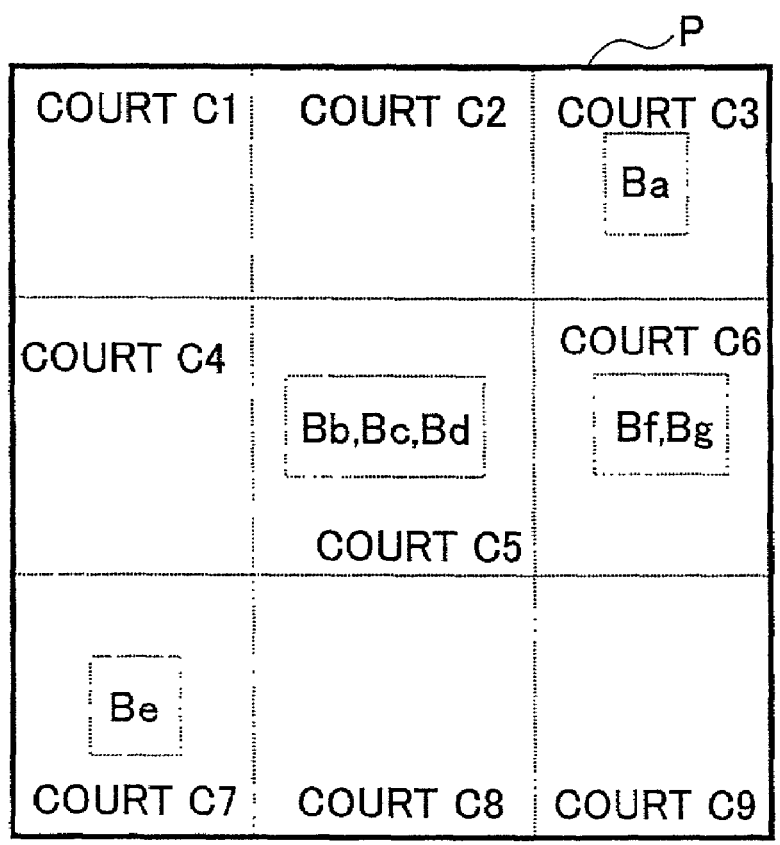
Figure 20A:
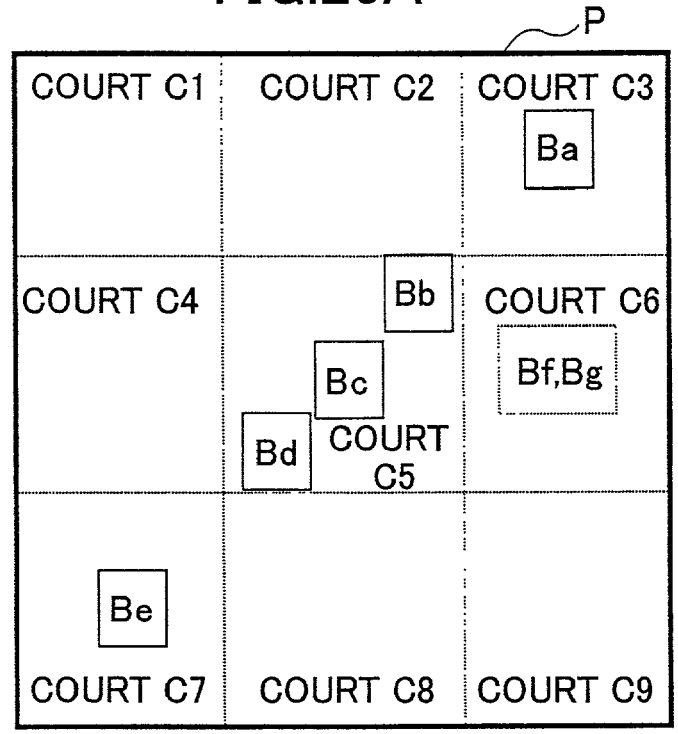
FIG. 20A and FIG. 20B are diagrams for explaining the placement of the cells on the branching paths.
Figure 20B:
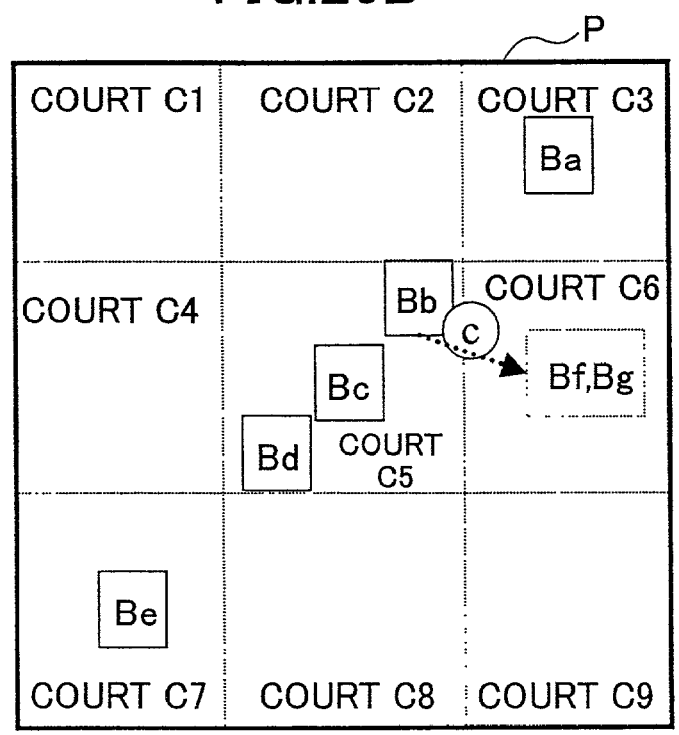
Figure 21:
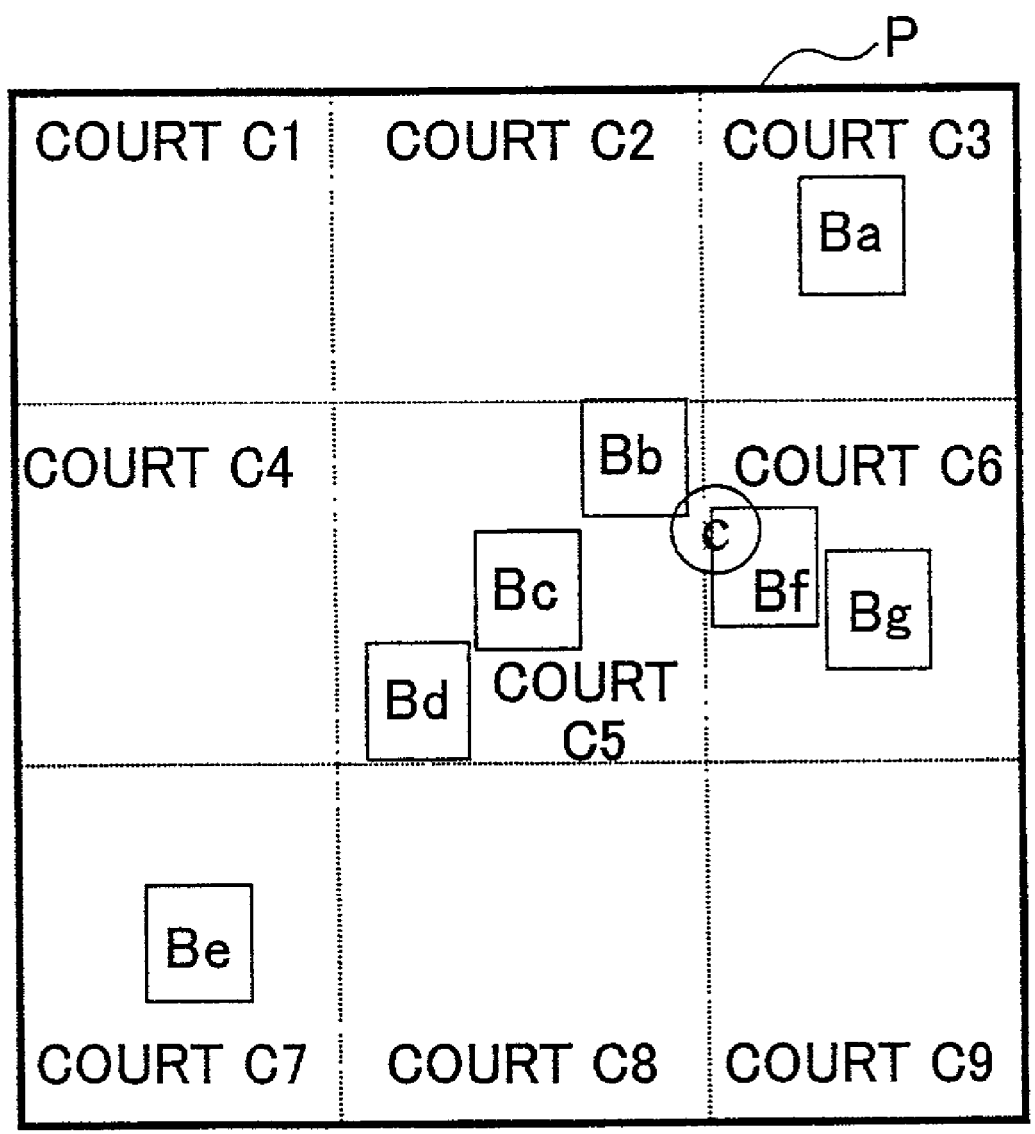
FIG. 21 is a diagram for explaining the placement of the cells on the branching paths.

FIG. 19A indicates the branching paths of the cells Ba–Bg. FIG. 19B indicates the placement of the cells Ba–Bg to the courts. FIG. 20A indicates the condition of the virtual placement of the cells Ba–Be to the courts. FIG. 20B indicates the condition of the virtual placement of the cells Bb–Bf and Bg. FIG. 21 indicates the condition of the virtual placement of all the cells Ba–Bg to the courts.

As shown in FIG. 19A, the cells Ba–Be are connected by the main path in order of Ba→Bb→Bc→Bd→Be. Moreover, as shown in FIG. 19A, the cells Bb, Bf and Bg are connected by the branched path in order of Bb→Bf→Bg.

As shown in FIG. 19B, the cells Ba–Bg are assigned such that the cell Be is assigned to the court C7, the cells Bb–Bd are assigned to the court C5, the cell Ba is assigned to the court C3, and the cells Bf and Bg are assigned to the court C6.

The virtual placement of the cells Ba–Be is carried out by the virtual placement method explained in FIG. 17 and FIG.

18. In addition, as for the priority of virtual placement, priority is given to a path with a longer path length at this time.

When performing the virtual placement of the cells Bf and Bg, the route coordinates c of the court C6 to which the cells Bf and Bg are assigned are first detected. Since the virtual placement position of the branching position cell Bb is already determined, the route coordinates c are determined by the positional relation between the virtual placement position of cell Bb and the court C6 where the cells Bf and Bg are assigned, and they are set as the intersection of the line segment which connects the peak and the center position of the court C6 close to the court C6 of the cell Bb, and the perimeter of the court C6.

Next, the cell Bf and the cell Bg are equally arranged on the line segment between the route coordinates a and the center coordinate of the court C6. As shown in FIG. 21, the virtual placement of the cells Ba–Bg is thus performed.

The placement and the size of the mounting blocks, the courts and the cells are set up as mentioned above.

Referring back to FIG. 4, a description will be given of the remaining steps of the integrated circuit design method.

When the condition that the cell ratio of each court is smaller than the reference value is satisfied at the step S5 by the above adjustment, the calculation of the path delay is performed at step S6. At the step S6, each of the calculated path delays is compared with a given reference value, and a list of the paths the path delay of which exceeds the reference value is provided. After the step S6 is performed, the list of the paths with the exceeding path delay is displayed to the output device 13 (S7). Moreover, the path routing is displayed to the output unit 13 (S8).

Figures 22A, 22B:
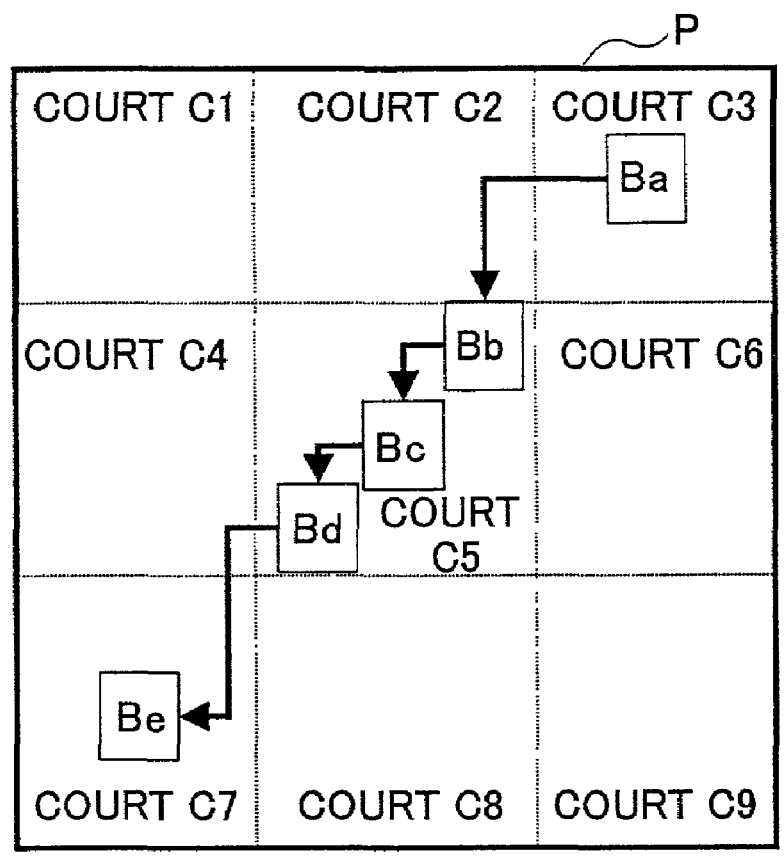
FIG. 22A and FIG. 22B are diagrams for explaining a delay calculation and a list of the delay calculation being displayed.

FIG. 22A and FIG. 22B show a path delay calculation and a list of the paths the delay of which is calculated.

FIG. 22A shows a path routing of the cells Ba–Be, and FIG. 22B shows a list of the paths of the cells Ba–Be with the exceeding path delays.

In the present embodiment, the Manhattan length calculation is used to determine the net line length of corresponding functional blocks between the cell Ba and the cell Bb, between the cell Bb and the cell Bc, between the cell Bc and the cell Bd, and between the cell Bd and the cell Be. According to the result of the Manhattan length calculation, the net delay and the gate delay are calculated in accordance with the calculation formula of the existing method. Based on the calculations of the net delay and the gate delay, the path routing is displayed as shown in FIG. 22A, and the list of the paths with the exceeding path delays (which is called the delay list) is displayed as shown in FIG. 22B. In FIG. 22B, "Tline" indicates the net delay, "Tcell" indicates the gate delay, and "Total" indicates the accumulated delay.

By referring to the delay list displayed as shown in FIG. 22B, the designer determines whether the path delay is larger than the reference value (S9). When the path delay is not larger than the reference value, it is determined that the desired circuit speed can be attained with the integrated circuit design, and the integrated circuit design process ends. When the path delay is larger than the reference value as the result at the step S9, the designer moves some of the functional blocks or cells Ba–Be to another court such that the path delay after the movement is less than the reference value (S10). After the step S10 is performed, it is determined that the desired circuit speed can be attained with the integrated circuit design, and the integrated circuit design process ends.

Figure 23A:
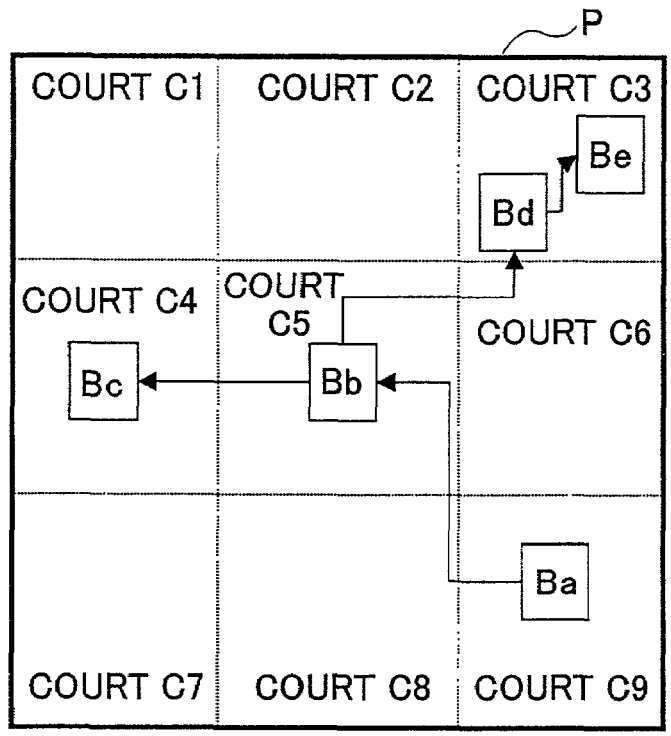
FIG. 23A and FIG. 23B are diagrams for explaining a movement operation that moves cells from one cell to another.
Figure 23B:
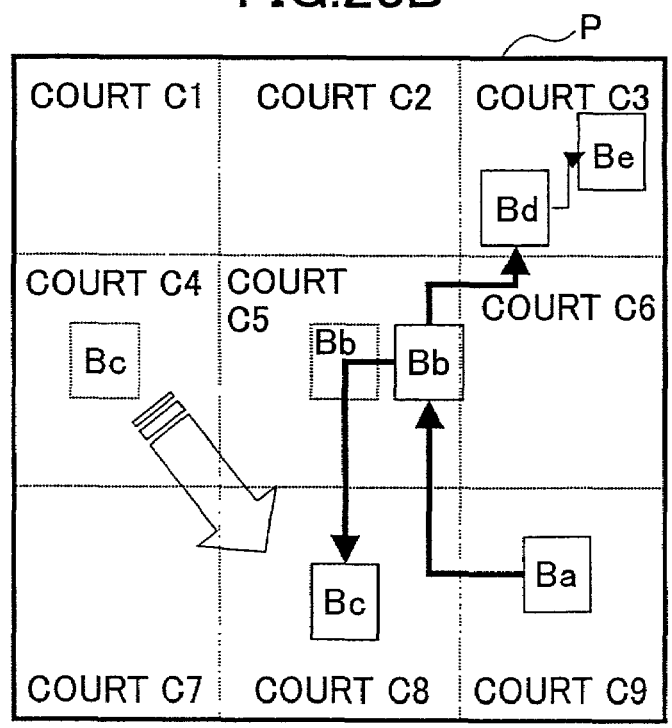
Figure 24:
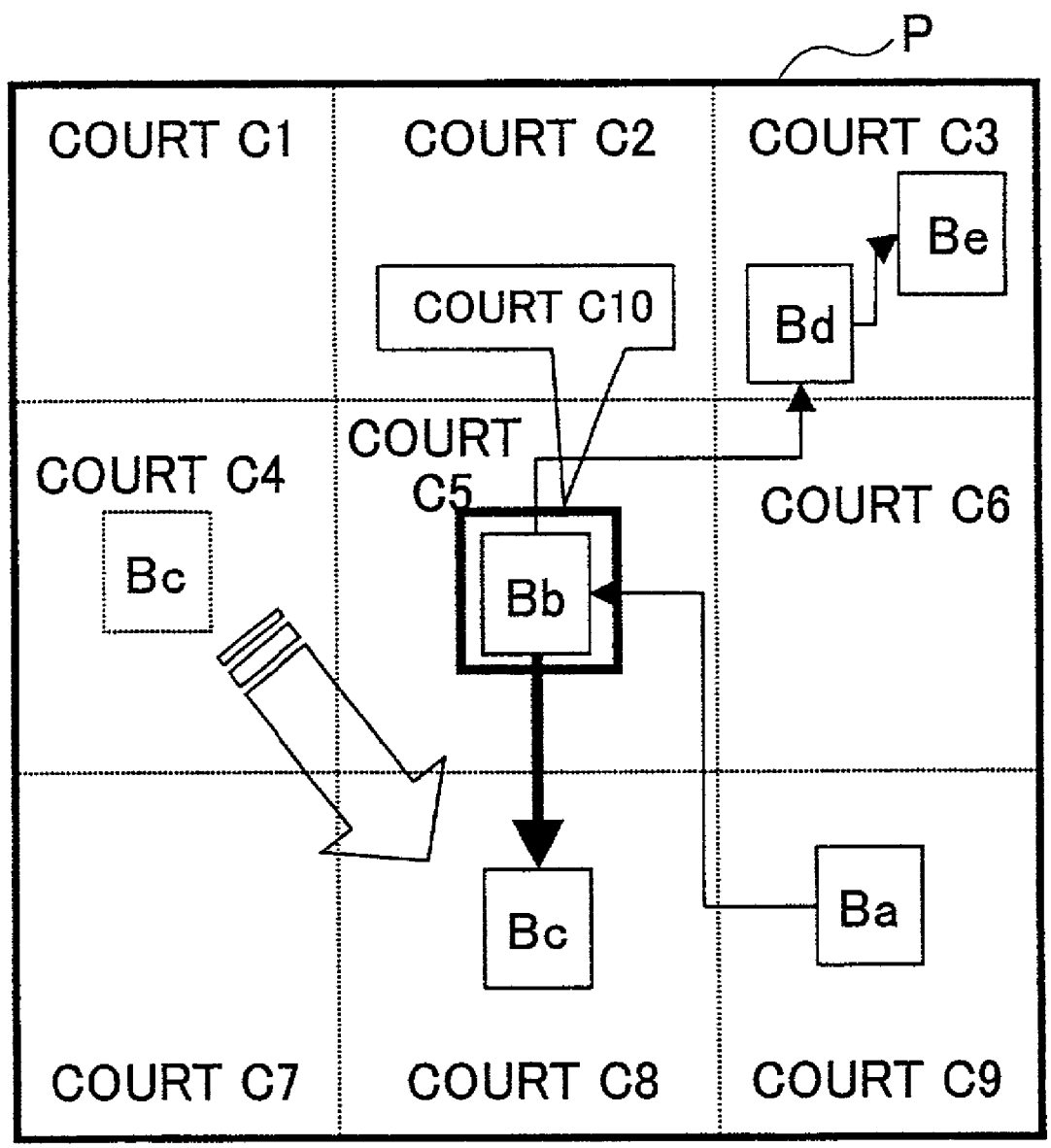
FIG. 24 is a diagram for explaining the movement operation that moves cells from one cell to another.

FIG. 23A and FIG. 23B show a movement operation that moves cells from one cell to another. FIG. 24 shows the movement operation that moves cells from one cell to another.

FIG. 23A shows an example of the connection relation of plural paths of functional blocks or cells. In FIG. 23A, there are two paths: the path of the cells connected along the line of the cell Ba→the cell Bb→the cell Bd→the cell Be, and the path of the cells connected along the line of the cell Ba→the cell Bb→the cell Bc. Suppose that, initially, the cell Ba is assigned to the court C9, the cell Bb is assigned to the court C5, the cell Bc is assigned to the court C4, and the cells Bd and Be are assigned to the court C3.

In the example of FIG. 23B, the cell Bc is moved from the cell C4 to the court C8, and, by using the virtual placement method shown in FIG. 17A through FIG. 21, the virtual placement of the cells to the courts is performed. In this case, a higher priority is given to the path having a larger path length. The virtual placement of the cells to the courts of the path along the line of Ba→Bb→Bd→Be is performed first.

As shown in FIG. 23B, the cell Bb is moved rightward in the court C5. In connection with this, the net line length between the cell Ba and the cell Bb and the net line length between the cell Bb and the cell Bd are changed. Consequently, the path delay of the cells arranged along the line of Ba→Bb→Bd→Be is changed.

In the present example, as a result of the movement of functional blocks or cells, the path delay of the other path is also changed. It is very difficult to obtain the desired delay, and the integrated circuit design process becomes complicated.

To avoid the above problem, it is necessary to make the path delay of the path of the cells arranged along the line of Ba→Bb→Bd→Be unchanged, even when the cell Bc is moved. For this purpose, it is necessary that the movement of the cell Bc does not result in the movement of the cell Bb.

As shown in FIG. 24, a new, narrow court C10 is provided at the location where the cell Bb in the court C5 is provided closely. The cell Bb is assigned to the court C10. By assigning the cell Bb to the court C10, the cell Bb remains in the narrow court C10 even if the cell Bb is moved. Namely, a significant movement of the cell Bb does not take place. Hence, the net line length between the cell Ba and the cell Bb and the net line length between the cell Bb and the cell Bd are hardly changed. Consequently, the path delay of the cells arranged along the line of Ba→Bb→Bd→Be remains unchanged from before, and it is possible to perform only the adjustment of the path delay of the cells arranged along the line of Bc→Bb.

Accordingly, the cell Bc is moved in the above-mentioned manner, and the path delay is adjusted so that it does not exceed the reference value.

Referring back to FIG. 4, after the adjustment is performed at the step S10, the design process is returned to the steps S3–S9. Consequently, the cell ratio is checked again at the step S5, the path delay is checked again at the step S9, and it is determined that the path delay is not larger than the reference value. Then, the design process ends.

Conventionally, the mounting blocks of hundreds of thousands gates have become the processing unit in the floor planning. However, according to the integrated circuit design apparatus of the present embodiment, the virtual placement regions (or courts) are created in the LSI chip T and the mounting blocks P according to the circuit scale. The processing unit in the present embodiment is reduced to the level of tens of thousands gates or less, and the timing analyses, such as the cell ratio of the floor planning data and the path delay, can be performed with high precision.

The integrated circuit design apparatus of the present embodiment makes it possible that the designer realize his intended layout image in the stage of floor planning, and it becomes possible to study the cause of the timing problem, which may arise after the mounting design, in the initial design stage. Therefore, it is possible to minimize the necessity of the re-design or design change as in the conventional design device. For this reason, the integrated circuit design apparatus of the present embodiment can efficiently carry out the integrated circuit design process. Moreover, since the path delay is taken into consideration, it contributes to the improvement in quality of an LSI circuit.

The present invention is not limited to the above-described embodiments, and variations and modifications may be made without departing from the scope of the present invention.

Further, the present invention is based on Japanese priority application No. 2001-266401, filed on Sep. 3, 2001, the entire contents of which are hereby incorporated by reference.

What is claimed is:

1. An integrated circuit design apparatus providing an integrated circuit design, comprising:
   a block placement processing unit performing processing of creation of a lower-rank mounting block in a higher-rank mounting block, each mounting block containing logic circuit cells, and performing processing of creation of virtual placement regions in each of the lower-rank mounting block and the higher-rank mounting block, wherein the virtual placement regions are created in an initial design stage before completing logic circuit cell placement design;
   a functional block assignment processing unit performing processing of assignment of functional blocks to each of the virtual placement regions provided by the block placement processing unit; and
   an evaluation processing unit providing a display of a condition of the functional blocks assigned to each of the virtual placement regions of both the lower-rank mounting block and the higher-rank mounting block, so that the condition of the assigned functional blocks is evaluated by a designer without moving the logic circuit cells in each virtual placement region wherein the evaluation processing unit, further:
      provides the designer with the display of a path delay in order to determine whether the path delay is larger than a reference value, and
      when the path delay is larger than the reference value, provides the designer with an adjustment function to adjust the path delay.

2. The integrated circuit design apparatus of claim 1 wherein, the evaluation processing unit includes an area ratio calculation processing unit which performs processing of calculation of an area ratio with respect to each of the respective virtual placement regions.

3. The integrated circuit design apparatus of claim 2 wherein the evaluation processing unit provides a display of a graph representation of the calculated area ratio provided by the area ratio calculation processing unit.

4. The integrated circuit design apparatus of claim 1 wherein the evaluation processing unit includes a path delay calculation processing unit which performs processing of calculation of a path delay with respect to each of respective paths of functional blocks.

5. The integrated circuit design apparatus of claim 4 wherein the path delay calculation processing unit compares each of the calculated path delays with a reference value, and provides a list of paths of functional blocks the path delay of which exceeds the reference value.

6. The integrated circuit design apparatus of claim 5 wherein the evaluation processing unit includes a path routing display processing unit which performs processing of displaying of a path routing of paths of functional blocks based on the list provided by the path delay calculation processing unit.

7. The integrated circuit design apparatus of claim 1 wherein the evaluation processing unit provides a designer with a movement function to move functional blocks from one of the virtual placement regions to another.

8. The integrated circuit design apparatus of claim 4 wherein the evaluation processing unit provides a display of a list of paths of functional blocks the calculated path delay of which exceeds a reference value, based on a result of the calculation provided by the path delay calculation processing unit.

9. An integrated circuit design apparatus providing an integrated circuit design, comprising:
   a block placement processing unit performing processing of creation of a lower-rank mounting block in a higher-rank mounting block, each mounting block containing logic circuit cells, and performing processing of creation of virtual placement regions in each of the lower-rank mounting block and the higher-rank mounting block, wherein the virtual replacement regions are created in an initial desicin stage before completing logic circuit cell placement design;
   a functional block assignment processing unit performing processing of assignment of functional blocks to each of the virtual placement regions provided by the block placement processing unit; and
   an evaluation processing unit providing a display of a condition of the functional blocks assigned to each of the virtual placement regions of both the lower-rank mounting block and the higher-rank mounting block, so that the condition of the assigned functional blocks is evaluated by a designer without moving the logic circuit cells in each virtual placement region, wherein:
      the evaluation processing unit further includes an area ratio calculation processing unit which performs processing of calculation of the area ratio with respect to each of the respective virtual placement regions, and
      the area ratio calculation process unit, further, performs processing of displaying of a calculation result with indications of power wiring and inhibition regions.

10. An integrated circuit design method providing an integrated circuit design, comprising:
    performing processing of creation of a lower-rank mounting block in a higher-rank mounting block, each mounting block containing logic circuit cells;
    performing processing of creation of virtual placement regions in each of the lower-rank mounting block and the higher-rank mounting block, wherein the virtual placement regions are created in an initial design stage before completing logic circuit cell placement design;
    performing processing of assignment of functional blocks to each of the virtual placement regions provided by the block placement processing unit; and
    providing a display of a condition of the functional blocks assigned to each of the virtual placement regions of both the lower-rank mounting block and the higherrank mounting block, so that the condition of the assigned functional blocks is evaluated by a designer without moving the logic circuit cells in each virtual placement regiont and providing the designer with the display of a path delay in order to determine whether the path delay is larger than a reference value, and, when the path delay is larger than the reference value, providing the designer with an adjustment function to adjust the path delay.

11. The integrated circuit design method of claim 10 wherein the providing step includes performing processing of calculation of an area ratio with respect to each of the respective virtual placement regions.

12. The integrated circuit design method of claim 11 wherein the providing step provides a display of a graph representation of the calculated area ratio.

13. The integrated circuit design method of claim 10 wherein the providing step includes performing processing of calculation of a path delay with respect to each of respective paths of functional blocks.

14. The integrated circuit design method of claim 13 wherein the providing step includes comparing each of the calculated path delays with a reference value, and providing a list of paths of functional blocks the path delay of which exceeds the reference value.

15. The integrated circuit design method of claim 14 wherein the providing step includes performing processing of displaying of a path routing of paths of functional blocks based on the list.

16. The integrated circuit design method of claim 10 wherein the providing step provides a designer with a movement function to move functional blocks from one of the virtual placement regions to another.

17. The integrated circuit design method of claim 13 wherein the providing step provides a display of a list of paths of functional blocks the calculated path delay of which exceeds a reference value, based on a result of the calculation.

18. An integrated circuit design method providing an integrated circuit design, comprising:
performing processing of creation of a lower-rank mounting block in a higher-rank mounting block, each mounting block, wherein the virtual placement regions are created in an initial design stage containing logic circuit cells;
performing processing of creation of virtual placement regions in each of the lower-rank mounting block and the higher-rank mounting block before completing logic circuit cell placement design;
performing processing of assignment of functional blocks to each of the virtual placement regions provided by the block placement processing unit; and
providing a display of a condition of the functional blocks assigned to each of the virtual placement regions of both the lower-rank mounting block and the higher-rank mounting block so that the condition of the assigned functional blocks is evaluated by a designer without moving the logic circuit cells in each virtual placement region, wherein the providing the display further comprises:
performing processing of calculation of an area ratio with respect to each of the respective virtual placement regions, and
performing processing of displaying of a calculation result with indications of power wiring and inhibition regions.

19. An integrated circuit design program causing a computer system to execute an integrated circuit design method for providing an integrated circuit design, the method comprising:
performing processing of creation of a lower-rank mounting block in a higher-rank mounting block, each mounting block containing logic circuit cells;
performing processing of creation of virtual placement regions in each of the lower-rank mounting block and the higher-rank mounting block, wherein the virtual placement regions are created in an initial design stage before completing logic circuit cell placement design;
performing processing of assignment of functional blocks to each of the virtual placement regions provided by the block placement processing unit; and
providing a display of a condition of the functional blocks assigned to each of the virtual placement regions of both the lowerrank mounting block and the higherrank mounting block, so that the condition of the assigned functional blocks is evaluated by a designer without moving the logic circuit cells in each virtual placement region the providing the display further comprising:
providing a designer with a display of a path delay in order to determine whether the path delay is larger than a reference value, and
when the path delay is larger than the reference value, providing the designer with an adjustment function to adjust the path delay.

20. The integrated circuit design program of claim 19 wherein the providing a display includes performing processing of calculation of an area ratio with respect to each of the respective virtual placement regions.

21. The integrated circuit design program of claim 20 wherein the providing step provides a display of a graph representation of the calculated area ratio.

22. The integrated circuit design program of claim 19 wherein the providing step includes performing processing of calculation of a path delay with respect to each of respective paths of functional blocks.

23. The integrated circuit design program of claim 22 wherein the providing step includes comparing each of the calculated path delays with a reference value, and providing a list of paths of functional blocks the path delay of which exceeds the reference value.

24. The integrated circuit design program of claim 23 wherein the providing step includes performing processing of displaying of a path routing of paths of functional blocks based on the list.

25. The integrated circuit design program of claim 19 wherein the providing step provides a designer with a movement function to move functional blocks from one of the virtual placement regions to another.

26. The integrated circuit design program of claim 22 wherein the providing step provides a display of a list of paths of functional blocks the calculated path delay of which exceeds a reference value, based on a result of the calculation.

27. An integrated circuit design program causing a computer system to execute an integrated circuit design method providing an integrated circuit design, the method comprising:
performing processing of creation of a lower-rank mounting block in a higher-rank mounting block, each mounting block containing logic circuit cells;
performing processing of creation of virtual placement regions in each of the lower-rank mounting block and the higher-rank mounting block, wherein the virtual placement regions are created in an initial design stage before completing logic circuit cell placement design;

performing processing of assignment of functional blocks to each of the virtual placement regions provided by the block placement processing unit; and providing a display of a condition of the functional blocks assigned to each of the virtual placement regions of both the lower-rank mounting block and the higher-rank mounting block, so that the condition of the assigned functional blocks is evaluated by a designer without moving the logic circuit cells in each virtual placement region integrated circuit design, the providing the display further comprising:

performing processing of calculation of an area ratio with respect to each of the respective virtual placement regions, and performing processing of displaying of a calculation result with indications of power wiring and inhibition regions.

* * * * *

UNITED STATES PATENT AND TRADEMARK OFFICE
CERTIFICATE OF CORRECTION

| | | |
|---|---|---|
| PATENT NO. | : 7,191,421 B2 | Page 1 of 1 |
| APPLICATION NO. | : 10/103895 | |
| DATED | : March 13, 2007 | |
| INVENTOR(S) | : Yasuo Amano et al. | |

It is certified that error appears in the above-identified patent and that said Letters Patent is hereby corrected as shown below:

Column 18, Line 31, change "desicin" to --design--.

Column 19, Line 4, change "regiont" to --region,--.

Column 19, Line 57, after "block" insert --,--.

Column 20, Line 18, change "lowerrank" to --lower-rank--.

Column 20, Line 18, change "higherrank" to --higher-rank--.

Column 20, Line 22, after "region" insert --,--.

Column 20, Line 23, after "providing" change "a" to --the--.

Column 22, Line 1, change "region integrated circuit design," to --region,--.

Signed and Sealed this

Tenth Day of July, 2007

JON W. DUDAS
*Director of the United States Patent and Trademark Office*